United States Patent
Ijima et al.

(10) Patent No.: US 12,412,861 B2
(45) Date of Patent: Sep. 9, 2025

(54) METAL JOINTED BODY, SEMICONDUCTOR DEVICE, WAVE GUIDE TUBE, AND METHOD FOR JOINING MEMBERS TO BE JOINED

(71) Applicant: Mitsubishi Electric Corporation, Tokyo (JP)

(72) Inventors: Takashi Ijima, Tokyo (JP); Koji Yamazaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 618 days.

(21) Appl. No.: 17/792,404

(22) PCT Filed: Mar. 27, 2020

(86) PCT No.: PCT/JP2020/014085
§ 371 (c)(1),
(2) Date: Jul. 13, 2022

(87) PCT Pub. No.: WO2021/192239
PCT Pub. Date: Sep. 30, 2021

(65) Prior Publication Data
US 2023/0054798 A1 Feb. 23, 2023

(51) Int. Cl.
*B23K 35/28* (2006.01)
*B23K 20/00* (2006.01)
(Continued)

(52) U.S. Cl.
CPC .......... *H01L 24/29* (2013.01); *B23K 20/008* (2013.01); *B23K 35/002* (2013.01);
(Continued)

(58) Field of Classification Search
CPC .............. B23K 20/008; B23K 20/2333; B23K 35/282; B23K 35/3006; B23K 2103/10;
(Continued)

(56) References Cited

U.S. PATENT DOCUMENTS

| 2013/0256390 A1* | 10/2013 | Yamaguchi ............ H01L 24/32 428/650 |
| 2014/0030634 A1 | 1/2014 | Nanbu et al. |
| 2015/0001280 A1 | 1/2015 | Nakagawa et al. |

FOREIGN PATENT DOCUMENTS

| CN | 103521910 A | 1/2014 |
| EP | 0117671 A1 | 9/1984 |

(Continued)

OTHER PUBLICATIONS

International Search Report and Written Opinion mailed on Jun. 16, 2020, received for PCT Application PCT/JP2020/014085, filed on Mar. 27, 2020, 8 pages including English Translation.

(Continued)

*Primary Examiner* — Ajay Ojha
*Assistant Examiner* — Sandra Milena Rodriguez Villanu
(74) *Attorney, Agent, or Firm* — XSENSUS LLP

(57) ABSTRACT

Provided is a metal jointed body, joined by solid-phase joining in the atmosphere, in which no protrusion of molten joining material occurs, that improves dimensional stability. A metal jointed body is formed by (A) making Ag films of two metal laminated bodies opposed to each other, the metal jointed body being configured by sequentially laminating a Zn film and an Ag film on an Al substrate serving as a member to be joined, and (B) bringing the Ag films into contact with each other, then (C) heating is performed while pressurizing, and closely adhering and solid-phase joining the Ag films to each other. The completed metal jointed body is a portion where Al—Ag alloy layers are provided on both sides of an Ag—Zn—Al alloy layer to join the Al substrates to each other.

11 Claims, 13 Drawing Sheets

(51) Int. Cl.
    *B23K 35/00*     (2006.01)
    *B23K 35/30*     (2006.01)
    *B23K 103/10*     (2006.01)
    *F21V 8/00*     (2006.01)
    *H01L 23/00*     (2006.01)
    *H01L 23/498*     (2006.01)
    *H01L 25/07*     (2006.01)
    *B23K 101/30*     (2006.01)

(52) U.S. Cl.
CPC ........ *B23K 35/282* (2013.01); *B23K 35/3006* (2013.01); *G02B 6/0096* (2013.01); *H01L 23/49811* (2013.01); *H01L 23/49844* (2013.01); *H01L 24/32* (2013.01); *H01L 24/83* (2013.01); *B23K 2101/30* (2018.08); *B23K 2103/10* (2018.08); *H01L 24/48* (2013.01); *H01L 24/73* (2013.01); *H01L 25/072* (2013.01); *H01L 2224/29005* (2013.01); *H01L 2224/29083* (2013.01); *H01L 2224/29118* (2013.01); *H01L 2224/29124* (2013.01); *H01L 2224/29139* (2013.01); *H01L 2224/29564* (2013.01); *H01L 2224/29575* (2013.01); *H01L 2224/29624* (2013.01); *H01L 2224/32225* (2013.01); *H01L 2224/32502* (2013.01); *H01L 2224/48137* (2013.01); *H01L 2224/48225* (2013.01); *H01L 2224/73265* (2013.01); *H01L 2224/83203* (2013.01); *H01L 2924/10253* (2013.01); *H01L 2924/1203* (2013.01); *H01L 2924/13055* (2013.01); *H01L 2924/351* (2013.01)

(58) Field of Classification Search
CPC . G02B 6/0096; H01L 23/49811; H01L 24/32; H01L 24/83; H01L 24/48; H01L 24/73; H01L 2224/29083; H01L 2224/29624; H01L 2224/73265; H01L 2224/83203; H01L 2924/351
See application file for complete search history.

(56) References Cited

FOREIGN PATENT DOCUMENTS

| | | |
|---|---|---|
| JP | 60-37281 A | 2/1985 |
| JP | 2012-71347 A | 4/2012 |
| JP | 2013-176782 A | 9/2013 |
| JP | 2015123485 A | 7/2015 |
| JP | 2015155108 A | 8/2015 |
| JP | 6516949 B1 | 5/2019 |
| WO | 2012029789 A1 | 3/2012 |

OTHER PUBLICATIONS

Office Action issued Mar. 10, 2025 in corresponding German patent application No. DE 112020006983.4 (25 pages; with English translation).

* cited by examiner

F I G. 1 2
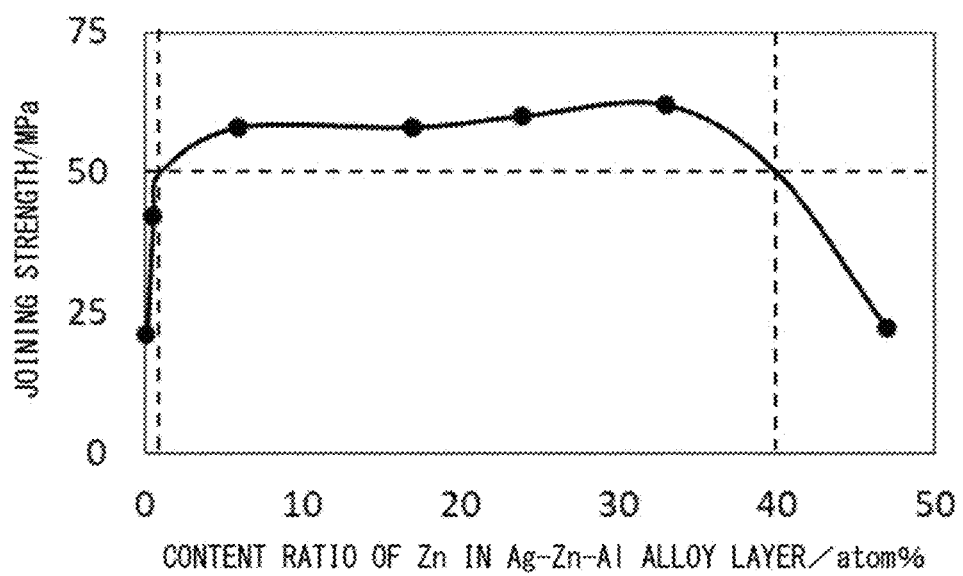

METAL JOINTED BODY, SEMICONDUCTOR DEVICE, WAVE GUIDE TUBE, AND METHOD FOR JOINING MEMBERS TO BE JOINED

CROSS-REFERENCE TO RELATED APPLICATION

The present application is based on PCT filing PCT/JP2020/014085, filed Mar. 27, 2020, the entire contents of which is incorporated herein by reference.

TECHNICAL FIELD

The present disclosure relates to a metal jointed body, a semiconductor device, a wave guide tube, and a method for joining members to be joined.

BACKGROUND ART

Conventionally, soldering is widely adopted for joining metal members in industrial products such as semiconductor devices and wave guide tubes. However, when solder with a high melting point is used due to the use of the product in the high-temperature operation, joining is required to be performed under a reducing atmosphere. Therefore, a technique has been proposed of generating a molten material by eutectic reaction by pressurizing and heating using an insert material containing zinc (Zn) and joining metal members in the atmosphere (for example, see Patent Document 1).

PRIOR ART DOCUMENTS

Patent Documents

[Patent Document 1] Japanese Patent Application Laid-Open No. 2013-176782

SUMMARY

Problem to be Solved by the Invention

However, in the joining using the insert material, there has been a problem that the adjustment of the dimensions of the object to be joined taking the protrusion of the molten material into consideration because of the generation and joining of the molten material by the eutectic reaction.

The present disclosure has been made to solve the above-mentioned problem, and an object of the present disclosure is to obtain a metal jointed body that is joined without melting the joining material.

Means to Solve the Problem

The metal jointed body according to the present disclosure includes an Ag—Zn—Al alloy layer and Al—Ag alloy layers provided on both sides of the Ag—Zn—Al alloy layer.

Effects of the Invention

According to the present disclosure, the effect is exhibited that the metal jointed body is joined by solid-phase joining, and no protrusion of molten joining material occurs, improving dimensional stability.

BRIEF DESCRIPTION OF DRAWINGS

FIG. 12 A graph showing the joining strength with respect to the Zn content in the Ag—Zn—Al alloy layer for the metal jointed body of the embodiments.

DESCRIPTION OF EMBODIMENT(S)

Figure 1:
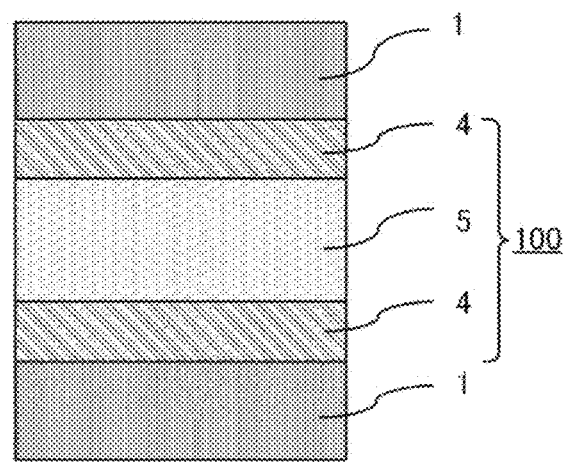
FIG. 1 A cross-sectional view showing a metal jointed body of a first embodiment.

Hereinafter, the Embodiments of the present invention will be described with reference to the drawings. In the following drawings, the same or corresponding parts are designated by the same reference numerals, and the description thereof will not be repeated.

First Embodiment

The method for joining a metal jointed body and the members to be joined of the first embodiment will be described with reference to FIGS. 1 to 2C. FIG. 1 is a cross-sectional view showing a metal jointed body 100 of the first embodiment. Also, FIGS. 2A to 2C, cross-sectional views, are for describing a method of manufacturing of the metal jointed body 100.

First, the configuration of the metal jointed body 100 will be briefly described with reference to FIG. 1. The details of the metal jointed body 100 will be described later in the description of the method for joining the members to be joined.

As shown in FIG. 1, the metal jointed body 100 is provided between two Al base materials 1 as a member to be joined, and is a portion for joining the Al base materials 1 to each other, and is a portion in which Al—Ag alloy layers 4 are provided for lamination on both sides of an Ag—Zn—Al alloy layer 5. That is, here, for the joining between the Al base materials 1 as the two members to be joined, the metal jointed body 100 consisting of an Al—Ag alloy layer 4, the Ag—Zn—Al alloy layer 5, and the Al—Ag alloy layer 4 is provided, and the composition of the entire laminated body is as follows: the Al base material 1, the Al—Ag alloy layer 4, the Ag—Zn—Al alloy layer 5, the Al—Ag alloy layer 4, and the Al base material 1.

Next, the method for joining the Al base materials 1 as the members to be joined will be described with reference to FIGS. 2A to 2C.

Figure 2A:
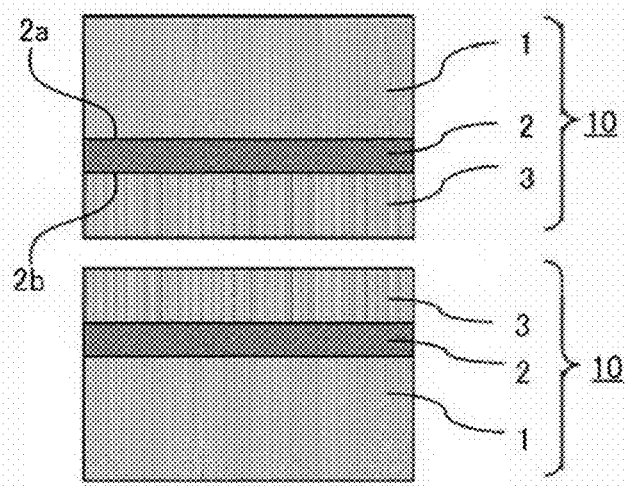
FIGS. 2A to 2C Cross-sectional views for describing a method for joining members to be joined of a first embodiment.
Figure 2B:
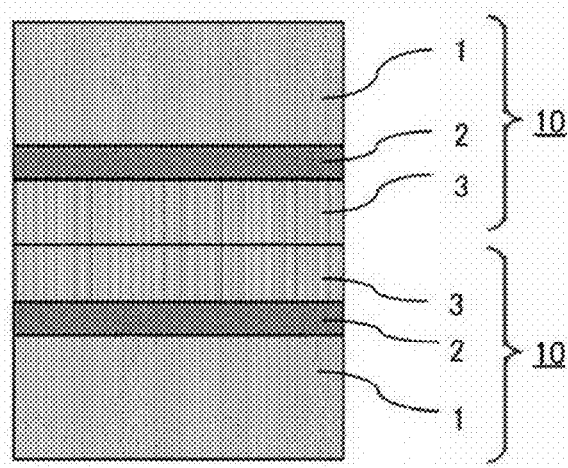
Figure 2C:
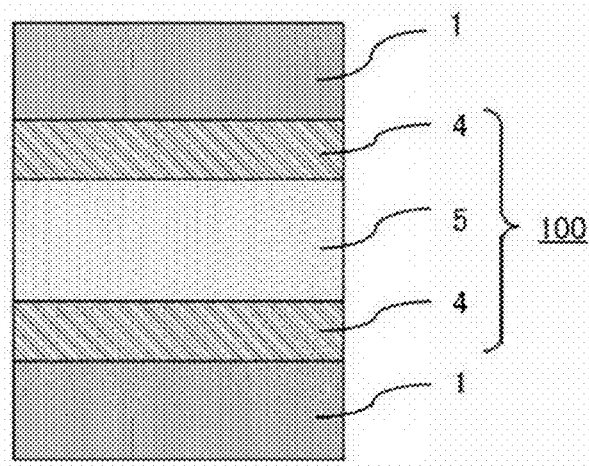

As a method of manufacturing the metal jointed body 100, first, as shown in FIG. 2A, two metal laminated bodies 10, each of which is produced by forming a Zn film 2, as a Zn layer, on the Al base material 1 (Al layer) as a member to be joined, and forming an Ag film 3, as an Ag layer, on a second surface 2b on the opposite side of a first surface 2a of the Zn film 2 joined on the Al substrate 1, are produced. That is, a metal laminated body 10 has a structure in which the Al base material 1, the Zn film 2, and the Ag film 3 are sequentially laminated.

Here, the Al base material 1 is an Al alloy member containing aluminum (Al) as a main component. The Al base material 1 is not limited to the Al alloy member as long as containing Al as the main component, and may be, for example, a member containing Al as the main component and of which the residual part contains impurities, or may be a member composed of only Al. The Al base material 1 preferably contains 99 atom % or more of Al, which is the main component, and even more preferably 100 atom % of Al.

The Zn film 2 is a thin film layer containing zinc (Zn) as a main component, and the Ag film 3 is a thin film layer containing silver (Ag) as a main component. It is desirable that the Zn film 2 and the Ag film 3 contain 99 atom % or more of Zn or Ag, which are the main components, respectively, and it is further preferable that they contain 100 atom % of Zn or Ag. There is no problem even if the residual parts of the Zn film 2 and the Ag film 3 may contain impurities.

Although the case where the Al layer is composed of the Al base material 1 as the member to be joined is described here as an example, the present embodiment is not limited thereto, and as the Al layer, instead of the Al base material 1, an Al film, provided in a thin film on the member to be joined, which is a separate member, may be adopted. That is, the member to be joined may be the Al base material or a separate member. When the member to be joined is the Al base material, the Al base material is an Al layer, and when the member to be joined is a separate member, the Al film formed on the member to be joined is an Al layer.

Further, in terms of the Al layer, the thickness thereof is not particularly limited in both cases of the Al layer being provided as a single member as in the Al substrate 1 of the present embodiment, and of the Al film being provided as a thin film on a separate member. Meanwhile, the Zn film 2 is preferably formed to be 0.1 μm or more and 2 μm or less from the viewpoint of forming an alloy by sufficient diffusion of atoms in order to secure stable adhesion. Also, the Ag film 3 is preferably formed to be 0.1 μm or more and 50 μm or less from the viewpoint of in addition to improving the joining strength by sufficient diffusion of atoms, forming thereof more uniformly.

The method for forming the Zn film 2 and the Ag film 3 is not particularly limited, and for example, in addition to electrolytic plating or electroless plating, physical vapor deposition (PVD), chemical vapor deposition (CVD), and sputtering are adoptable. The film forming conditions are not particularly limited and are appropriately set according to the method and apparatus to be used. The film thickness is determined by calculating an appropriate film formation time from the film formation rate in the selected method. When the Al film is provided on a separate member as the Al layer, the film can be formed by the same method.

After the metal laminated bodies 10 are produced in this manner, as shown in FIG. 2A, the Ag films 3 whose surfaces are exposed in the two metal laminated bodies 10 are opposed to each other. Then, as shown in FIG. 2B, the Ag films 3 of the two metal laminated bodies 10 are brought into contact with each other (first step). After that, heating is performed while pressurizing the Ag films 3 in contact with each other to bring the Ag films 3 into close contact with each other (second step). As a result, atomic diffusion occurs between the layers, so that the two metal laminated bodies 10 are solid-phase joined to each other.

Here, "solid phase joining" represents that the metal material in each metal layer of the metal laminated bodies is joined without melting, that is, they are joined together in a solid phase (solid) state. In particular, sufficient adhesion is crucial for solid-phase joining between the metal layers. This is because in solid-phase joining, the diffusion of atoms becomes facilitated as the adhesion increases, making joining shorter in time with lower pressure. Further, in order to improve the adhesion, bringing clean and active surfaces of layers into contact with each other is crucial when the layers are in contact with each other. In the present embodiment, oxide films on the surfaces of the Ag films 3 are removed by heating while pressurizing, thereby improving the adhesion between the Ag films 3 and promoting solid-phase joining.

As a method of pressurization and heating, the metal laminated bodies 10 are held in a heated state for a certain period of time at a temperature at which solid-phase joining can be started while applying a predetermined load. The oxide films are formed on the Ag films 3 under normal temperature and pressure, and the oxide films are decomposed and removed by heating at 200° C. or higher. Therefore, the treatment is not limited to, for example, a treatment in a vacuum atmosphere or a treatment in a reducing atmosphere such as an atmosphere of formic acid, hydrogen, nitrogen or the like, and the he oxide films of the surfaces of Ag films 3 can be removed by pressurizing and heating in the atmosphere.

Regarding heating, the temperature at which solid-phase joining can be started is typically 200° C. or higher in the case of Ag in the atmosphere, however, 250° C. or higher and 400° C. or lower are preferable in consideration of deformation of members and diffusion of atoms. The pressing force is not particularly limited, and is preferably 0.1 MPa or more and 200 MPa or less, and is preferably lower than the strength of the member from the viewpoint of suppressing deformation. In particular, in the heated state, the pressing force is more preferably 0.5 MPa or more and 100 MPa or less from the viewpoint of promoting joining by adhesion and suppressing deformation of the metal film due to softening. The pressurization and heating time may be appropriately set according to the heating temperature and the pressing force, however, one minute or more and 12 hours or less is preferable, and 10 minutes or more and 3 hours or less is more preferable.

In this manner, the Ag films 3 are pressurized and heated to be brought into close contact with each other, so that the Zn atoms in the Zn films 2 are diffused into the Ag films 3 in the two metal laminated bodies 10 and some Al atoms in the Al base materials 1 and some Ag atoms in the Ag films 3 mutually diffuse. Then, when the two metal laminated bodies 10 are solid-phase joined, as shown in FIG. 2C, the overall laminated structure is as follows: the Al base material 1, the Al—Ag alloy layer 4, the Ag—Zn—Al alloy layer 5, the Al—Ag alloy layer 4, and the Al base material 1. At this point, a part of the Al base material 1 of the metal laminated body 10 before joining remains as the Al base material 1 after joining. A portion having the Al—Ag alloy layers 4 on both sides of the Ag—Zn—Al alloy layer 5 and having a laminated structure of the Al—Ag alloy layer 4, the Ag—Zn—Al alloy layer 5, and the Al—Ag alloy layer 4 is the metal jointed body 100, and the Al base materials 1 as the two members to be joined are joined via the metal jointed body 100.

After the laminated structure of the Al—Ag alloy layer 4, the Ag—Zn—Al alloy layer 5, and Al—Ag alloy layer 4 is formed by solid-phase joining, pressurization and heating is halted and cooling is preferably performed by natural heat dissipation. Further, although in solid-phase joining, a concentration gradient due to the diffusion of atoms may be present in each layer, this does not cause a decrease in joining strength. Therefore, the composition of each layer does not have to be uniform in the entire layer. Further, the formed metal jointed body 100 is integrated with the Al base materials 1 on both sides thereof, the boundary between the layers may actually be indefinite.

When the whole structure is assumed to be 100 atom %, it is preferable that the Ag—Zn—Al alloy layer 5 contains Al of 1 atom % or more and 10 atom % or less, Zn component of 1 atom % or more and 40 atom % or less, and of which the residual part contains Ag as the main component. When the whole structure is assumed to be 100 atom %, it is preferable that the Al—Ag alloy layer 4 contains Ag of 1 atom % or more and 10 atom % or less and of which the residual part contains Al as the main component. In addition, when the requirement of the joining strength is not so high, it is not always necessary to apply this component ratio.

The effect of the joining method for the metal jointed body 100 and the member to be joined thus configured will be described.

Conventionally, there is a method for joining members by melting a joining material such as a solder material or an insert material, and in such a method, the molten solder material or the insert material may protrude from the joint surface at the time of joining; which requires the adjustment of the size thereof. In addition, an ample area is required for the stable arrangement of the joining material, which increases the overall size and weight. Further, when the joint area or thickness of the molten joint material is large, voids are less likely to come off and voids may be generated after curing; therefore, adjustment of the joint area is required to perform so as not to generate voids. Further, when an insert material or the like containing Zn as a main component is used, there is a problem in use thereof because the Zn deposited on the surface after joining is likely to be corroded in a high humidity environment or the like.

Therefore, in the method for joining the metal jointed body 100 and the member to be joined of the present embodiment, the metal jointed body 100 and the member to be joined are joined by solid-phase joining, no conventional solder material, insert material, or the like is used, and no molten joining material protrudes out so that the effect of improving the dimensional stability is exhibited. Further, this produces the effect that the size and the weight of the entire member after joining can be reduced.

Further, in the method for joining the metal jointed body 100 and the member to be joined of the present embodiment, the metal jointed body 100 is formed by solid-phase joining and no molten joint material is involved; therefore, no protrusion or voids are generated unlike as in the case with a solder material or an insert material, exhibiting the effect that the degree of freedom in design related to the joint area can be improved. Further, the joining is performed by the solid-phase joining; therefore, the effect of being able to obtain a metal jointed body having high joining reliability with suppressed deformation due to melting is further exhibited.

Further, although the metal jointed body 100 of the present embodiment contains Zn, the Al—Ag alloy layer 4 contains Al and the Ag—Zn—Al alloy layer 5 contains Ag as main components, respectively, and Zn is not their main component; therefore, the effect of being able to perform highly reliable joining even in a high humidity environment is exhibited. In addition, the metal jointed body 100 as a whole is configured to contain Ag as a main component, which is superior in terms of thermal conductivity and heat resistance.

Further, in the metal laminated body 10 before the metal jointed body 100 is formed, the adhesion is ensured by forming each layer by plating or the like; therefore, no concern about a decrease in strength at the boundaries is raised, other than between the Ag films 3 which are the joining layers between the members. Therefore, the effect of improving the stability of production and the reliability of joining is exhibited.

Further, in the joining method for the members to be joined of the present embodiment, a vacuum atmosphere or a reducing atmosphere such as an atmosphere of formic acid, hydrogen, nitrogen or the like is not required, and joining can be performed in the atmosphere. Therefore, no equipment such as a vacuum heating furnace or a heating reducing furnace is required, leading to the cost reduction, and the effect of the maintenance of the equipment being easy is exhibited. In addition, the joining can be performed in a state where oxidation of Zn and Al is suppressed in the atmosphere; therefore, the effect of improving the reliability of joining is exhibited.

Second Embodiment

Figure 3:
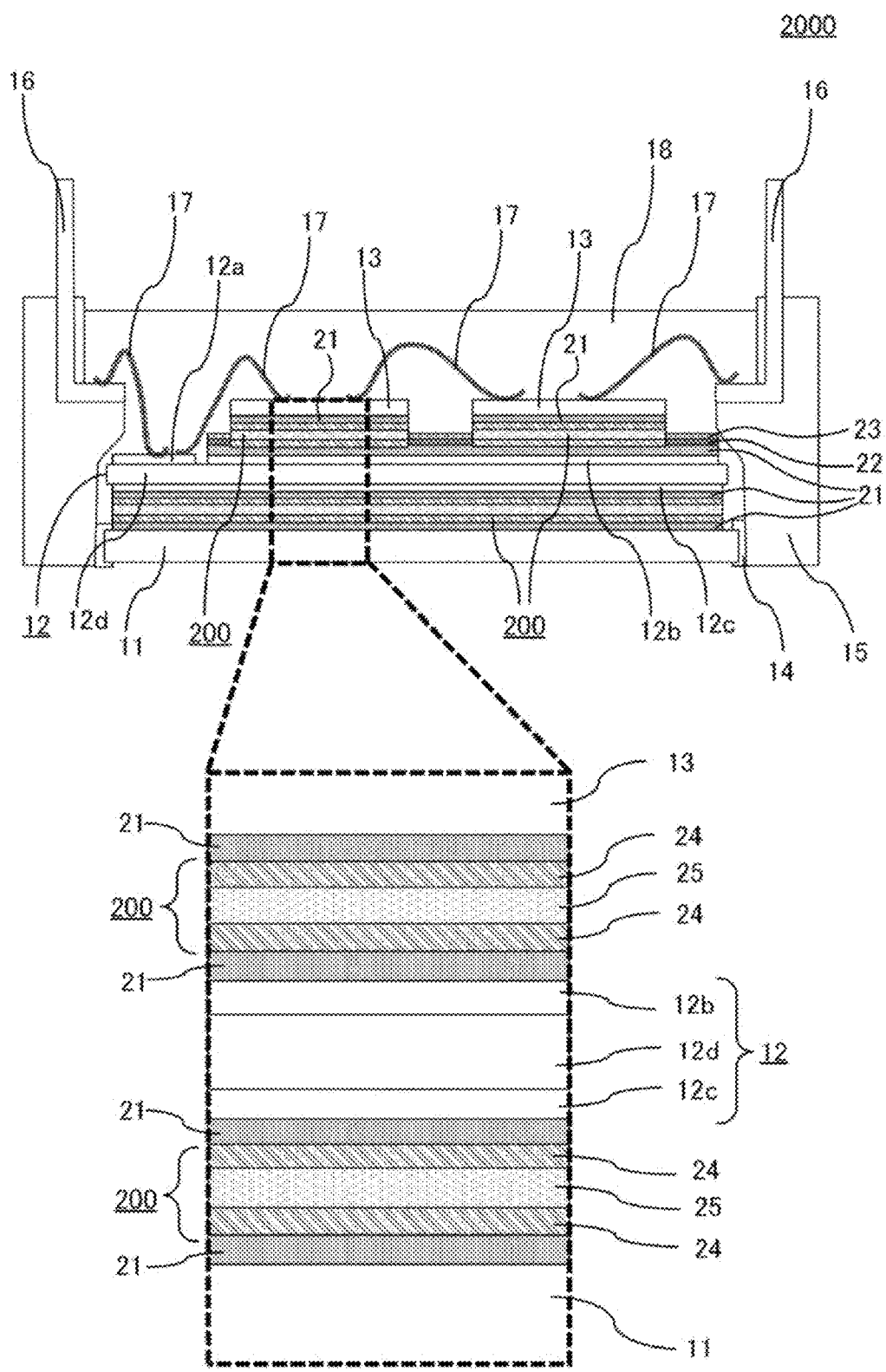
FIG. 3 A cross-sectional view illustrating a semiconductor device of a second embodiment.

A semiconductor device and a manufacturing method of the semiconductor device of the second embodiment will be described with reference to FIG. 3. FIG. 3 is a cross-sectional view illustrating a semiconductor device 2000 of the present embodiment.

First, the overall configuration of the semiconductor device 2000 will be described.

As illustrated in FIG. 3, the semiconductor device 2000 includes a metal base 11, a wiring board 12 to which a back surface conductor layer 12c is joined on the metal base 11, two semiconductor elements 13 mounted on a front surface conductor layer 12b of the wiring board 12, a case 15, joined by an adhesive 14 to the outer peripheral side surface of the metal base 11, a plurality of external terminals 16 mounted on the case 15, wires 17 that electrically connect the front surface conductor layer 12a of the wiring board 12, the semiconductor elements 13, and the external terminals 16, and a sealing material 18 that fills the area surrounded by the metal base 11 and the case 15.

Each of between the metal base 11 and the back surface conductor layer 12c of the wiring board 12 and between the front surface conductor layer 12b of the wiring board 12 and the semiconductor elements 13 is joined via the metal jointed body 200 and an Al film 21 provided on both sides of the metal jointed body 200.

In the present embodiment, although a case will be described where each of between the metal base 11 and the back surface conductor layer 12c of the wiring board 12 and between the front surface conductor layer 12b of the wiring board 12 and the semiconductor elements 13 is joined with the metal jointed body 200, the present embodiment is not limited thereto, and the structure need only be the one in which the metal jointed body 200 is provided and joined in at least one of between the metal base and the wiring board and between the wiring board and the semiconductor elements. When only one of between the metal base and the wiring board and between the wiring board and the semiconductor elements is joined via the metal jointed body 200, the other is joined by, for example, solder, sintered silver, or the like.

The metal base 11 is formed of Cu (copper). The back surface conductor layer 12c of the wiring board 12 is joined on the metal base 11 via the metal jointed body 200 and the Al films 21 provided on both sides of the metal jointed body 200, and the case 15 is adhered to the outer peripheral side surface of the metal base 11 by the adhesive 14. The metal base 11 is not limited to the one made of Cu, and may be formed of an alloy such as an aluminum-silicon carbide (AlSiC) alloy or a copper-molybdenum (CuMo) alloy.

Further, the metal base may be formed of Al. In this case, an Al film is not required to be formed on the metal base, and the metal jointed body 200 can be provided in contact with the metal base.

As shown in FIG. 3, the wiring board 12 is integrally configured with a ceramic substrate 12d as an insulating layer made of aluminum nitride (AlN) and a conductor layer composed of the front surface conductor layers 12a and 12b, being made of Cu, and the back surface conductor layer 12c provided on both sides of the ceramic substrate 12d. As shown in FIG. 3, the front surface conductor layers 12a and 12b are patterned as conductor layers on the surface of the wiring board 12, opposite to the back surface conductor layer 12c joined to the metal base 11. The semiconductor elements 13 are mounted on the front surface conductor layer 12b.

In the present embodiment, the case where AN is used as the material of the ceramic substrate 12d of the wiring board 12 will be described, however, the material is not limited thereto, and ceramic materials such as alumina ($Al_2O_3$) and silicon nitride (SiN) may also be adopted. Further, a glass epoxy board may also be used as the wiring board. Further, the front surface conductor layers 12a and 12b and the back surface conductor layer 12c are not limited to those made of Cu, and may be made of, for example, Ni or Al. When the front surface conductor layers 12a and 12b and the back surface conductor layer 12c are made of Al, no Al films on the front surface conductor layers and the back surface conductor layer are required to be formed, and the front surface conductor layers 12a and 12b and the back surface conductor layer 12c, serving as Al base materials, can be joined together, as with the metal jointed body 100 of the first embodiment.

Further, in the present embodiment, although the case where the metal base 11 and the wiring board 12 are separately provided will be described, the present invention is not limited thereto, and a metal-based insulating substrate, in which the metal base plate composed of Cu, Al, etc. and an insulating layer in which a heat conductive filler such as boron nitride (BN) or $Al_2O_3$ is dispersed in an epoxy resin or the like are integrally laminated, having the functions of both the metal base and the wiring board, may also be used. The use of a metal-based insulating substrate allows the reduction in the weight and size of the semiconductor device. When an integrated metal-based insulating substrate is used, the metal jointed body 200 is provided and joined between the metal-based insulating substrate and the semiconductor elements.

On the front surface conductor layer 12b of the wiring board 12, for example, one Insulated Gate Bipolar Transistor (IGBT) and one diode are each joined via the metal jointed body 200 and the Al films 21 provided on both sides of the metal jointed body 200, and mounted as semiconductor elements 13. The semiconductor element 13 is made of, for example, Si (silicon) as a semiconductor material. Further, as shown in FIG. 3, the Al film 21, the Zn film 22, and an Ag film 23 are formed in this order in the region on the front surface conductor layer 12b where the semiconductor elements 13 are not provided.

Further, in the present embodiment, a semiconductor device including an IGBT and a diode as the semiconductor elements 13 will be described, but the present invention is not limited thereto, and a semiconductor element such as a Metal Oxide Semiconductor Field Effect Transistor (MOSFET) may be provided, or an Integrated Circuit (IC) for control that drives and controls the semiconductor element may be provided. Further, although in the present embodiment, an example in which the semiconductor element is made of Si as a semiconductor material will be described, the present invention is not limited thereto, and a wide-bandgap semiconductor material such as SiC (silicon carbide), GaAs (gallium arsenide), GaN (gallium arsenide), or diamond may also be adoptable.

Further, although in the present embodiment, a case of a 1in1 module configuration in which one pair of IGBT and diode are mounted will be described, the present invention is not limited thereto, and a discrete component in which one semiconductor element is mounted or a configuration of a 2in1 including two pairs or a 6in1 including six pairs may be adopted.

The case 15 is formed of polyphenylene sulfide (PPS), has a frame-like shape having a plurality of faces surrounding the outer periphery of the metal base 11 and the wiring board 12, and is joined to the metal base 11 with a silicone adhesive 14. A plurality of external terminals 16 made of Cu are attached to the case 15 by insert molding. Although, in the present embodiment, the case where PPS is used as the material of the case 15 will be described, the present invention is not limited thereto, and the case 15 may be formed of a thermoplastic resin such as polybutylene terephthalate (PBT) or polyether ether ketone (PEEK), or may be formed of liquid crystal polymer (LCP).

Further, although in the present embodiment, the configuration in which the case 15 is adhered to the outer peripheral side surface of the metal base 11 by the adhesive 14 will be described, the present invention is not limited thereto, and a configuration may be adopted in which the case is provided on the outer peripheral side surface of the wiring board and the wiring board and the case are joined by an adhesive.

The wires 17 are made of Al and electrically connect the front surface conductor layers 12a and 12b of the wiring board 12, the semiconductor elements 13, and the external terminals 16. Although in the present embodiment, the case where the wires 17 are made of Al will be described, the present invention is not limited thereto, and a Cu wire, an Al-coated Cu wire, an Au (gold) wire, or the like may also be adopted, or a ribbon bond or the like may also be adopted. Further, the circuit may be formed by soldering an electrode plate instead of the wire.

The sealing material 18 is filled in a region surrounded by the metal base 11 and the case 15, thereby sealing the semiconductor elements 13. The sealing material 18 is formed of an electrically insulating resin such as an epoxy resin, a silicone resin, a urethane resin, a polyimide resin, a polyamide resin, or an acrylic resin. The sealing material 18 may also be formed of an insulating composite material in which a filler that improves the mechanical strength and thermal conductivity of the sealing material 18 is dispersed. Fillers that improve the mechanical strength and thermal conductivity of the sealing material 18 include, for example, $SiO_2$ (silicon dioxide), $Al_2O_3$ (alumina), AlN (aluminum nitride), BN (boron nitride), $Si_3N_4$ (silicon nitride), diamond, and an inorganic ceramic material such as SiC (silicon carbide) or $B_2O_3$ (boron oxide).

Figure 4A:
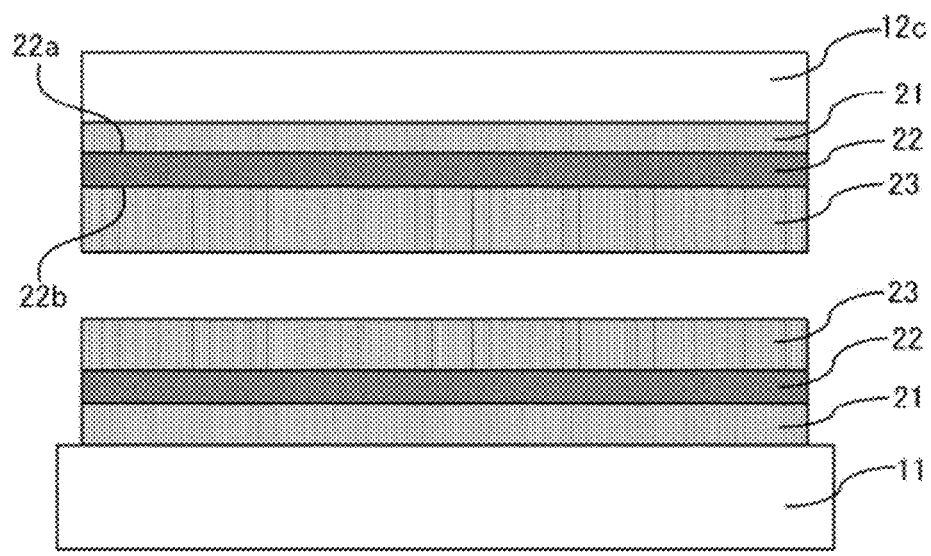
FIGS. 4A to 4C Cross-sectional views for describing a method for joining a metal base and a wiring substrate, which is a part of the manufacturing process of the semiconductor device of a second embodiment.
Figure 4B:
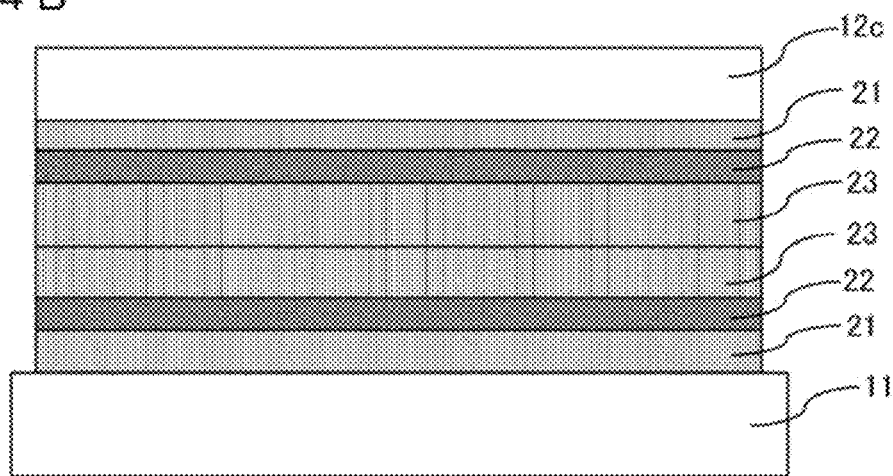
Figure 4C:
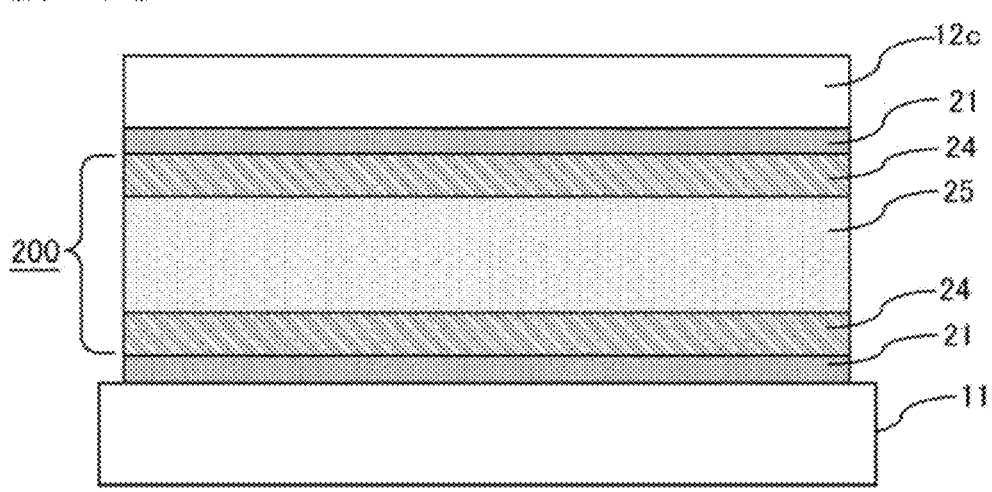

Next, a method of manufacturing the semiconductor device 2000 will be described with reference to FIGS. 4A to 5C. FIGS. 4A to 4C, cross-sectional views, are for describing a method for joining the metal base 11 and the back surface conductor layer 12c of the wiring substrate 12, which is a part of the manufacturing process of the semiconductor device 2000 of the present embodiment, and FIGS. 5A to 5C, cross-sectional views, are for describing a method for joining the semiconductor elements 13 and the front surface conductor layer 12b of the wiring substrate 12, which is a part of the manufacturing process of the semiconductor device 2000. The method of manufacturing the semiconductor device 2000 described in the present embodiment is partially common to the joining method for the member to be joined described in the first embodiment; therefore, points that differ from this will be mainly described.

First, the back surface conductor layer 12c of the wiring board 12 is solid-phase joined onto the metal base 11. As a result, the metal jointed body 200 is formed, and the metal base 11 and the back surface conductor layer 12c are joined via the metal jointed body 200 and the Al films 21 formed on both sides of the metal jointed body 200.

Hereinafter, the details of the method for joining the metal base 11 and the back surface conductor layer 12c will be described with reference to FIGS. 4A to 4C.

First, as shown in FIG. 4A, an Al film 21 as an Al layer is formed on the metal base 11 as a member to be joined, a Zn film 22 is formed on the Al film 21, and further a laminated body, which is formed by laminating the Ag film 23 on a second surface 22b which is opposite to a first surface 22a of the Zn film 22, joined on the Al film 21 and a laminated body, which is formed by laminating the Al film, the Zn film 22, and the Ag film 23 are formed on the back surface conductor layer 12c of the wiring board 12 serving as the member to be joined similar to the metal base 11, are produced.

Here, the Al films 21 are thin film-like layers containing Al as a main component. The Al films 21 may be any as long as containing Al as the main component, and may be, for example, a member containing Al as the main component and of which the residual part contains impurities, or may be a member composed of only Al. The Al films 21 preferably contain 99 atom % or more of Al, which is the main component, and even more preferably 100 atom % of Al.

The Zn film 22 is a thin film layer containing Zn as a main component, and the Ag film 23 is a thin film layer containing Ag as a main component. It is desirable that the Zn film 22 and the Ag film 23 contain 99 atom % or more of Zn and Ag, which are the main components, respectively, and it is further preferable that they contain 100 atom % of Zn and Ag. There is no problem even if the residual parts of the Zn film 22 and the Ag film 23 may contain impurities.

Further, the thickness of the Al film 21 is not particularly limited. Meanwhile, the Zn film 22 is preferably formed to be 0.1 μm or more and 2 μm or less from the viewpoint of forming an alloy by sufficient diffusion of atoms in order to secure stable adhesion. Also, the Ag film 23 is preferably formed to be 0.1 μm or more and 50 μm or less from the viewpoint of in addition to improving the joining strength by sufficient diffusion of atoms, forming thereof more uniformly.

The method for forming the Al film 21, the Zn film 22, and the Ag film 23 is not particularly limited, and can be formed by, for example, electrolytic plating, electroless plating, physical vapor deposition, chemical vapor deposition, sputtering, or the like. The film forming conditions are not particularly limited and are appropriately set according to the method and apparatus to be used. The film thickness is determined by calculating an appropriate film formation time from the film formation rate in any procedure to be applied.

Next, as shown in FIG. 4A, the exposed Ag film 23 of each of laminated bodies is brought to face each other, the laminated body being a body in which the Al film 21, the Zn film 22, and the Ag film 23 are formed on the metal base 11 and the laminated body being a body in which the Al film 21, the Zn film 22, and the Ag film 23 are formed on the back surface conductor layer 12c of the wiring board 12. Then, as shown in FIG. 4B, the Ag films 23 are brought into contact with each other (first step). After that, heating is performed while pressurizing the Ag films 23 in contact with each other to bring the Ag films 23 into close contact with each other (second step). As a result, atomic diffusion occurs between the layers, so that the metal base 11 and the back surface conductor layer 12c are solid-phase joined to each other via the metal jointed body 200. The conditions such as the temperature and pressure for solid-phase joining are the same as the method for joining the members to be joined in the first embodiment; therefore, the description thereof will be omitted.

In this manner, the Ag films 23 are pressurized and heated to be brought into close contact with each other, so that the Zn atoms in the Zn films 22 are diffused into the Ag films 23 in the two laminated bodies and some Al atoms in the Al films 21 and some Ag atoms in the Ag films 23 mutually diffuse. Then, when the metal base 11 and the back surface conductor layer 12c are solid-phase joined, as shown in FIG. 4C, a laminated structure having a joining part of the metal base 11, the Al film 21, the Al—Ag alloy layer 24, the Ag—Zn—Al alloy layer 25, Al—Ag alloy layer 24, the Al film 21, and the back surface conductor layer 12c is obtained. At this point, a part of the Al film 21 of the laminated body before joining remains as the Al film 21 after joining. A portion having the Al—Ag alloy layers 24 on both sides of the Ag—Zn—Al alloy layer 25 and having a laminated structure of the Al—Ag alloy layer 24, the Ag—Zn—Al alloy layer 25, and the Al—Ag alloy layer 24 is the metal jointed body 200, and the metal base 11 and the back surface conductor layer 12c are joined via the metal jointed body 200 and the Al films 21 provided on both sides thereof.

After the laminated structure of the Al—Ag alloy layer 24, the Ag—Zn—Al alloy layer 25, and Al—Ag alloy layer 24 is formed by solid-phase joining, pressurization and heating is halted and cooling is preferably performed by natural heat dissipation. Further, although in solid-phase joining, a concentration gradient due to the diffusion of atoms may be present in each layer, this does not cause a decrease in joining strength. Therefore, the composition of each layer does not have to be uniform in the entire layer. Further, the formed metal jointed body 200 is integrated with the Al films 21 on both sides thereof; therefore, each boundary between the layers is indefinite.

When the whole structure is assumed to be 100 atom %, it is preferable that the Ag—Zn—Al alloy layer 25 contains Al of 1 atom % or more and 10 atom % or less, Zn component of 1 atom % or more and 40 atom % or less, and of which the residual part contains Ag as the main component. When the whole structure is assumed to be 100 atom %, it is preferable that the Al—Ag alloy layer 24 contains Ag of 1 atom % or more and 10 atom % or less and of which the residual part contains Al as the main component. In addition, in a case where the requirement of the joining strength is not so high or the like, it is not always necessary to use this component ratio.

As a result, the metal jointed body 200 is formed, and the metal base 11 and the back surface conductor layer 12c, serving as the members to be joined, are joined via the metal jointed body 200 and the Al films 21 formed on both sides of the metal jointed body 200.

Next, the semiconductor element 13 is solid-phase joined onto the front surface conductor layer 12b of the wiring board 12. As a result, the metal jointed body 200 is formed, and the front surface conductor layer 12b and the semiconductor element 13 are joined via the metal jointed body 200 and the Al films 21 formed on both sides of the metal jointed body 200.

Hereinafter, the details of the method for joining the front surface conductor layer 12b and the semiconductor element 13 will be described with reference to FIGS. 5A to 5C.

Figure 5A:
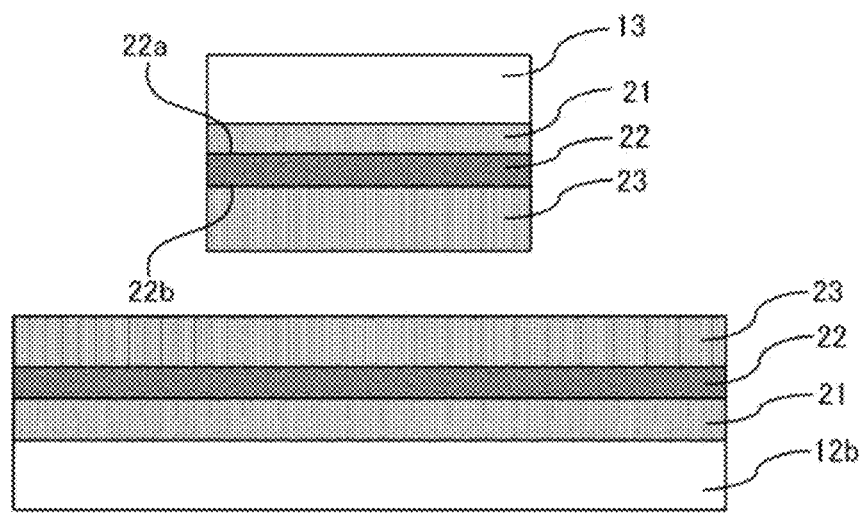
FIGS. 5A to 5C Cross-sectional views for describing a method for joining a semiconductor element and the metal base, which is a part of the manufacturing process of the semiconductor device of a second embodiment.
Figure 5B:
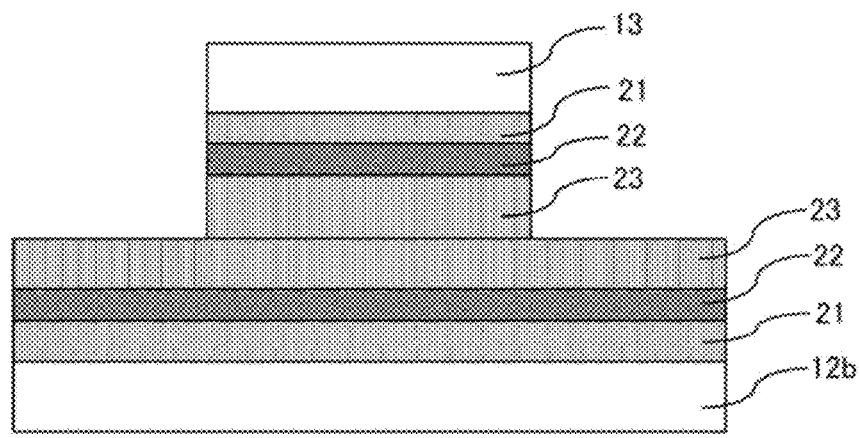
Figure 5C:
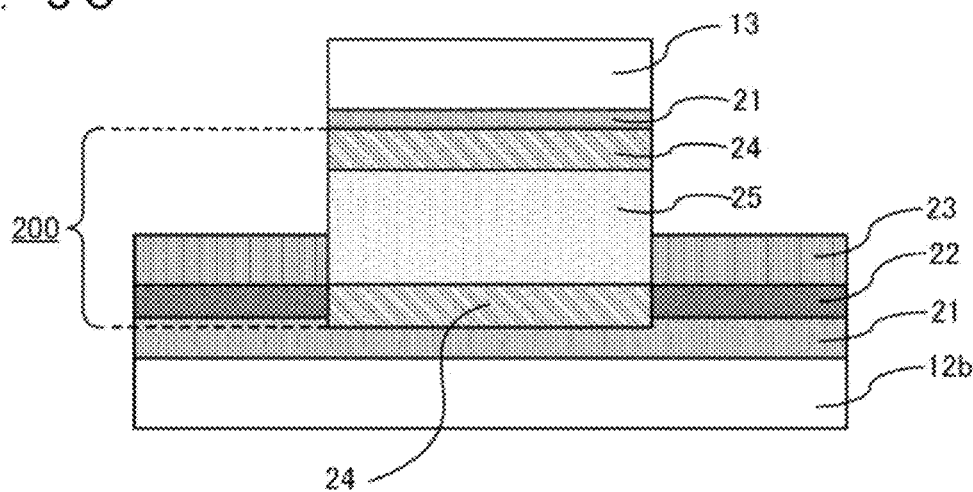

First, as shown in FIG. 5A, an Al film 21 as an Al layer is formed on the semiconductor element 13, a Zn film 22 is formed on the Al film 21, and further a laminated body, which is formed by laminating the Ag film 23 on a second surface 22b which is opposite to a first surface 22a of the Zn film 22, joined on the Al film 21 and a laminated body, which is formed by laminating the Al film 21, the Zn film 22, and the Ag film 23 are formed on the front surface conductor layer 12b of the wiring board similar to the semiconductor 13, are produced.

Here, although an example is shown in which the Al film 21, the Zn film 22, and the Ag film 23 are formed on the entire surface of the front surface conductor layer 12b of the wiring board 12, the configuration is not limited thereto and the film may be formed only in the range of contact with the semiconductor element 13, that contributes to joining, for example. Further, although an example in which the Al film 21, the Zn film 22 and the Ag film 23 are sequentially formed on the semiconductor element 13 is shown here, for example, as an adhesion-imparting layer between the semiconductor element 13 and the Al film 21, a Ti film may be formed. Its type and film thickness are not limited as long as the adhesion can be secured. In addition, a film of various metals or the like may further be formed on the front surface conductor layer 12b or the back surface conductor layer 12c of the wiring board 12 or on the metal base 11.

Here, the Al films 21 are thin film-like layers containing Al as a main component. The Al films 21 may be any as long as containing Al as the main component, and may be, for example, a member containing Al as the main component and of which the residual part contains impurities, or may be a member composed of only Al. The Al films 21 preferably contain 99 atom % or more of Al, which is the main component, and even more preferably 100 atom % of Al.

The Zn film 22 is a thin film layer containing Zn as a main component, and the Ag film 23 is a thin film layer containing Ag as a main component. It is desirable that the Zn film 22 and the Ag film 23 contain 99 atom % or more of Zn and Ag, which are the main components, respectively, and it is further preferable that they contain 100 atom % of Zn and Ag. There is no problem even if the residual parts of the Zn film 22 and the Ag film 23 may contain impurities.

Further, the thickness of the Al film 21 is not particularly limited. Meanwhile, the Zn film 22 is preferably formed to be 0.1 µm or more and 2 µm or less from the viewpoint of forming an alloy by sufficient diffusion of atoms in order to secure stable adhesion. Also, the Ag film 23 is preferably formed to be 0.1 µm or more and 50 µm or less from the viewpoint of in addition to improving the joining strength by sufficient diffusion of atoms, forming thereof more uniformly.

The method for forming the Al film 21, the Zn film 22, and the Ag film 23 is not particularly limited, and can be formed by, for example, electrolytic plating, electroless plating, physical vapor deposition, chemical vapor deposition, sputtering, or the like. The film forming conditions are not particularly limited and are appropriately set according to the method and apparatus to be used. The film thickness is determined by calculating an appropriate film formation time from the film formation rate in any procedure to be applied.

Next, as shown in FIG. 5A, the exposed Ag film 23 of each of laminated bodies is brought to face each other, the laminated body being a body in which the Al film 21, the Zn film 22, and the Ag film 23 are formed on the semiconductor element 13 and the laminated body being a body in which the Al film 21, the Zn film 22, and the Ag film 23 are formed on the front surface conductor layer 12b of the wiring board 12. Then, as shown in FIG. 5B, the Ag films 23 are brought into contact with each other (first step).

After that, heating is performed while pressurizing the Ag films 23 in contact with each other to bring the Ag films 23 into close contact with each other (second step). As a result, atomic diffusion occurs between the layers, so that the semiconductor 13 and the front surface conductor layer 12b are solid-phase joined to each other via the metal jointed body 200. The conditions such as the temperature and pressure for solid-phase joining are the same as the method for joining the members to be joined in the first embodiment; therefore, the description thereof will be omitted.

In this manner, the Ag films 23 are pressurized and heated to be brought into close contact with each other, so that the Zn atoms in the Zn films 22 are diffused into the Ag films 23 in the two laminated bodies and some Al atoms in the Al films 21 and some Ag atoms in the Ag films 23 mutually diffuse. Then, when the semiconductor element 13 and the front surface conductor layer 12b are solid-phase joined, as shown in FIG. 5C, the lamination structure of the semiconductor element 13, the Al film 21, the Al—Ag alloy layer 24, the Ag—Zn—Al alloy layer 25, the Al—Ag alloy layer 24, the Al film 21, the front surface conductor layer 12b is obtained. At this point, a part of the Al film 21 of the laminated body before joining remains as the Al film 21 after joining. A portion having the Al—Ag alloy layers 24 on both sides of the Ag—Zn—Al alloy layer 25 and having a laminated structure of the Al—Ag alloy layer 24, the Ag—Zn—Al alloy layer 25, and the Al—Ag alloy layer 24 is the metal jointed body 200, and the semiconductor element 13 and the front surface conductor layer 12b are joined via the metal jointed body 200 and the Al films 21 provided on both sides thereof.

After the laminated structure of the Al—Ag alloy layer 24, the Ag—Zn—Al alloy layer 25, and Al—Ag alloy layer 24 is formed by solid-phase joining, pressurization and heating is halted and cooling is preferably performed by natural heat dissipation. Further, although in solid-phase joining, a concentration gradient due to the diffusion of atoms may be present in each layer, this does not cause a decrease in joining strength. Therefore, the composition of each layer does not have to be uniform in the entire layer. Further, the formed metal jointed body 200 is integrated with the Al films 21 on both sides thereof; therefore, each boundary between the layers is indefinite.

When the whole structure is assumed to be 100 atom %, it is preferable that the Ag—Zn—Al alloy layer 25 contains Al of 1 atom % or more and 10 atom % or less, Zn component of 1 atom % or more and 40 atom % or less, and of which the residual part contains Ag as the main component. When the whole structure is assumed to be 100 atom %, it is preferable that the Al—Ag alloy layer 24 contains Ag of 1 atom % or more and 10 atom % or less and of which the residual part contains Al as the main component. In addition, in a case where the requirement of the joining strength is not so high or the like, it is not always necessary to use this component ratio.

It should be noted that, although a case is shown here in which the metal jointed body 200 made from the Al—Ag alloy layer 24, the Ag—Zn—Al alloy layer 25, the Al—Ag alloy layer 24 serving as a solid-phase portion is formed only in the range of contact with the Ag film 23 on the semiconductor element 13, and the Al film 21, the Zn film 22, the Ag film 23 remain in the other region on the front surface conductor layer 12b, the case is not limited thereto, and there may be a case where the Al—Ag alloy layer 24 and the Ag—Zn—Al alloy layer 25 are sequentially laminated also in a region where the semiconductor element 13 is not mounted on the surface conductor layer 12b of the wiring board 12. This is due to atoms being diffused by heating even if the Ag films 21 are not in close contact with each other.

Accordingly, the metal jointed body 200 is formed, and the front surface conductor layer 12b and the semiconductor element 13, serving as members to be joined, are joined via the metal jointed body 200 and the Al films 21 formed on both sides of the metal jointed body 200.

Noted that, for the method of manufacturing the semiconductor device 200 of the present invention, the description has been made of the method for joining the front surface conductor layer 12b and the semiconductor element 13 with each other after joining the back surface conductor layer 12c and the metal base 11 with each other, the method is not limited thereto, and the joining of the back surface conductor layer 12c and the metal base 11 and the joining of the front surface conductor layer 12b and the semiconductor element 13 may be simultaneously performed.

After the metal jointed body 200 is completed through the above procedure, the outer peripheral side surface of the metal base 11 joined to the wiring board 12 on which the semiconductor element 13 is mounted and the case 15 are joined to each other using the silicone adhesive 14.

Then, a plurality of wires 17 are each formed by wire bonding, to electrically connect the front surface conductor layers 12a and 12b of the wiring board 12, the semiconductor element 13, and the external terminals 16. When an electrode plate is used instead of the wires, the electrode plate is electrically connected by soldering in this step.

Next, the liquid resin material is filled in the area surrounded by the metal base 11 and the case 15 and cured by heating. As a result, the semiconductor element 13 is insulated and sealed by the sealing material 18. Through the above steps, the semiconductor device 2000 is completed.

The effects of the semiconductor device 2000 and the method of manufacturing the semiconductor device 2000 configured through the procedure will be described.

The joining strength gained by the joining of the metal jointed body 200 of the semiconductor device 2000 of the present embodiment is several times higher than the joining strength gained by the conventionally used solder material; therefore, the resistance to deterioration due to strain due to thermal stress is improved, leading to an effect of improvement in heat resistance. In addition, Ag is the main component of the joint portion of the metal jointed body 200 as a whole; therefore, the melting point exceeds 900° C. Therefore, as compared with a solder material or the like having a melting point of about 200° C., melting or the like does not occur even in a high temperature operating environment, leading to an effect of improvement in the joining reliability.

In particular, in recent years, from the viewpoint of energy-saving efforts, the development of semiconductor devices using SiC, GaN, etc., which have low power loss, as materials for semiconductor devices has been promoted. These semiconductor elements become a high temperature of over 200° C. during operation; therefore, even the operating temperature of the semiconductor device is also increasing year by year. Therefore, the semiconductor device 2000 of the present embodiment has heat resistance even for such a semiconductor device operating at a high temperature, exhibiting an effect of improvement in reliability.

Further, in the method of manufacturing the semiconductor device 2000 of the present embodiment, the metal films are formed by a film-forming method such as electrolytic plating; therefore, an effect, that forming films of a laminated body in a thin film and uniform manner is more facilitated than by a method in which joining layers are formed by printing and insertion of a braising filler material, is exhibited.

Although in the present embodiment, a configuration in which the metal jointed body 200 is provided in the semiconductor device provided with the case has been described as an example, it goes without saying, for example, that a molded semiconductor device without a case may also be adopted as long as a structure in which the metal jointed body 200 is provided and joined between the semiconductor element and the wiring board or between the wiring board and the metal base.

THIRD EMBODIMENT

Figure 6A:
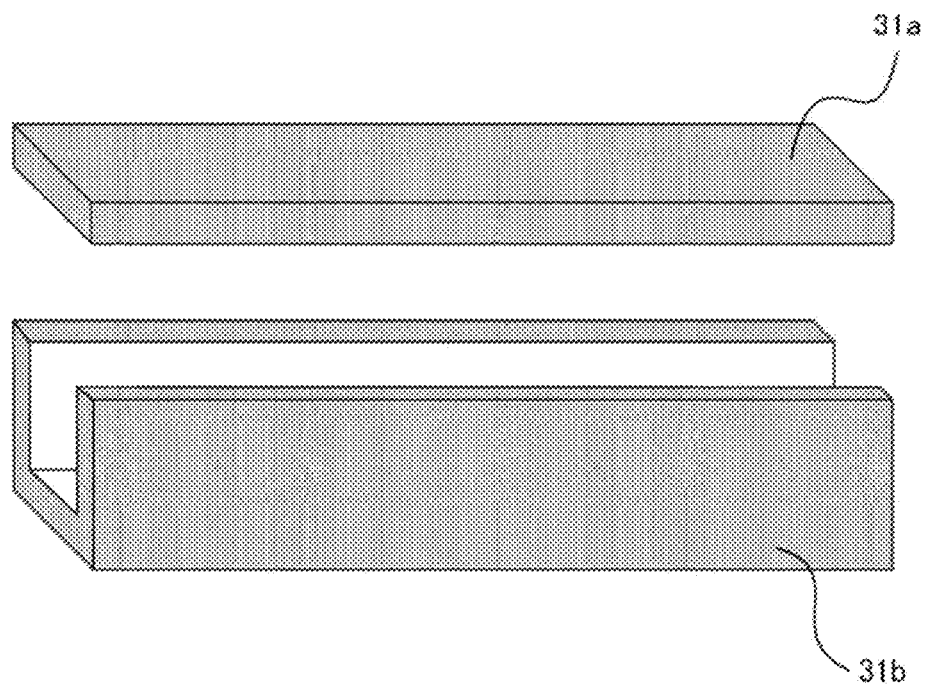
FIGS. 6A and 6B Perspective views for describing the wave guide tube of a third embodiment.
Figure 6B:
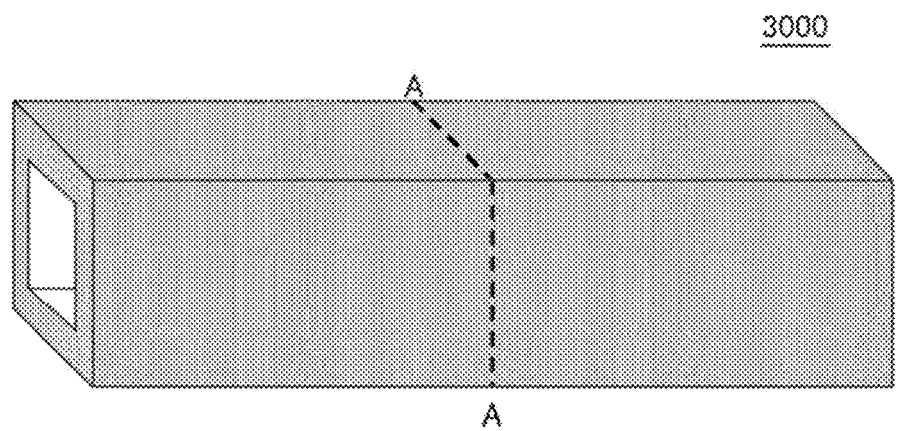
Figure 7:
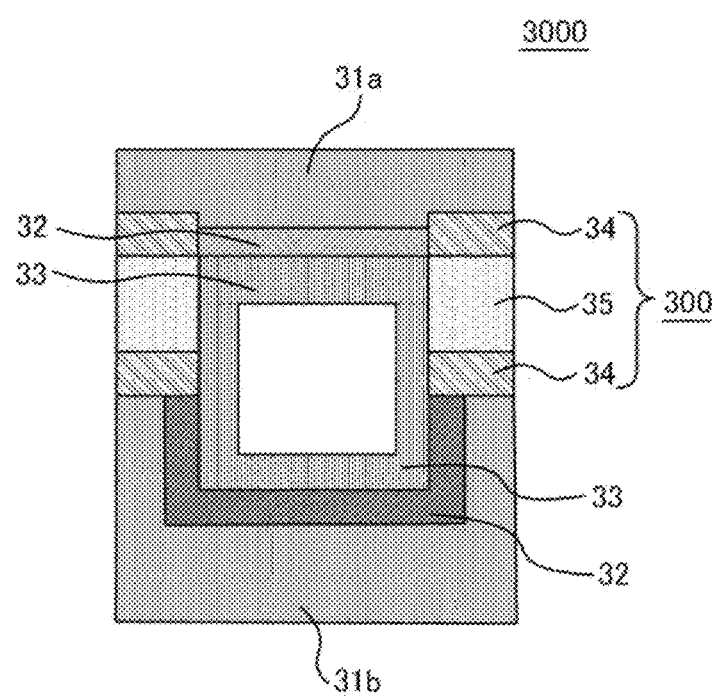
FIG. 7 A cross-sectional view illustrating the wave guide tube of a third embodiment.
Figure 8A:
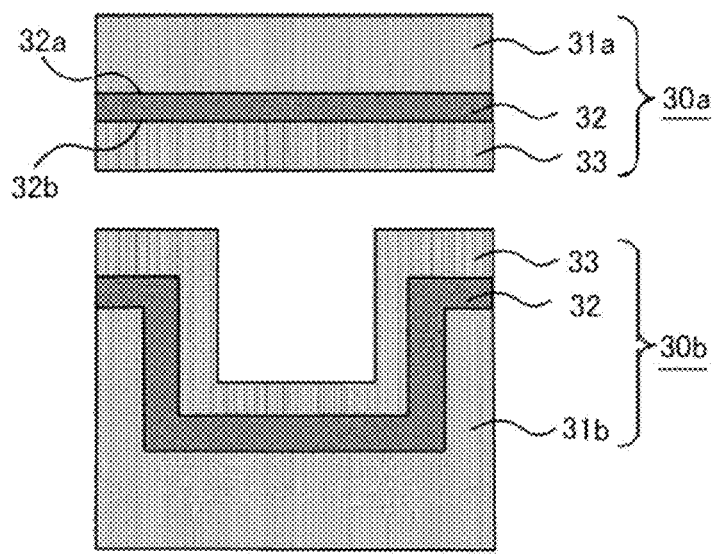
FIGS. 8A to 8C Cross-sectional views for describing a method of manufacturing the wave guide tube of the third embodiment.
Figure 8B:
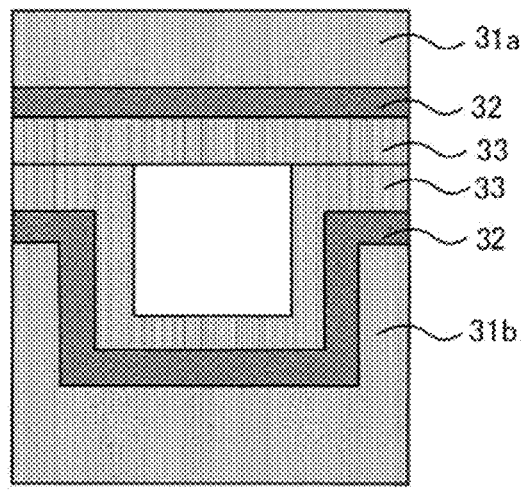
Figure 8C:
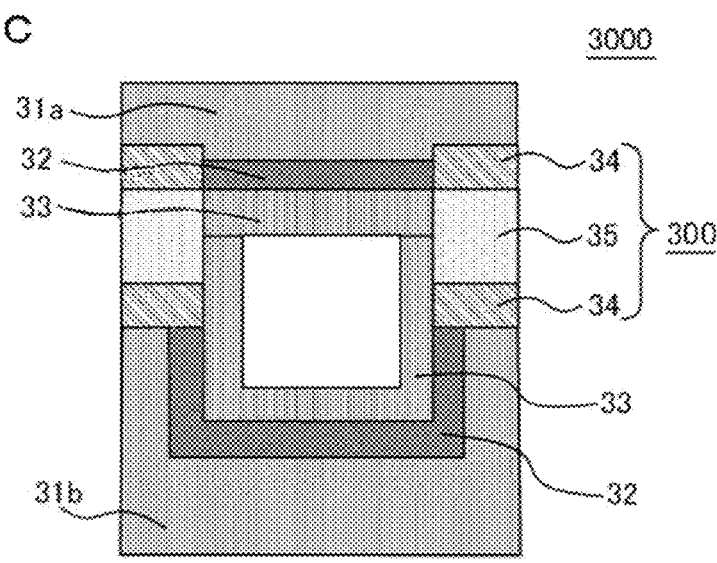

A wave guide tube and a method of manufacturing a wave guide tube of a third embodiment will be described with reference to FIGS. 6A to 8C. FIGS. 6A and 6B are perspective views for describing a wave guide tube 3000 of the present embodiment, and FIG. 7 is a cross-sectional view of the wave guide tube 3000 taken along the line A-A of FIG. 6B. FIGS. 8A to 8C, cross-sectional views, are for describing a method of manufacturing the wave guide tube 3000 of a third embodiment.

First, the overall configuration of the wave guide tube 3000 will be briefly described with reference to FIGS. 6A to 7. The details of the wave guide tube 3000 will be described later in the description of the method of manufacturing the wave guide tube 3000.

The wave guide tube 3000 is used, for example, for an antenna, and as shown in FIG. 6A, a long plate-shaped upper Al member 31a and a long plate-shaped lower Al member 31b having a concave cross section are joined each other, and is integrally molded into a tubular shape having a cavity thereinside as shown in FIG. 6B. A part of the side wall of the wave guide tube 3000 is joined by forming a metal jointed body 300 having Al—Ag alloy layers 34 on both sides of an Ag—Zn—Al alloy layer 35, as shown along A-A cross-section of FIG. 6B in FIG. 7. In FIG. 6B, in order to show the overall structure of the wave guide tube 3000, the metal jointed body 300 and the like, which are the joint portions, are omitted.

The metal jointed body 300 provided in the wave guide tube 3000 is a portion for joining the upper Al member 31a and the lower Al member 31b, and is a portion where the Al—Ag alloy layers 34 are formed and laminated on both sides of the Ag—Zn—Al alloy layer 35. It is a formed and laminated part. That is, at least at the joint portion between the upper Al member 31a and the lower Al member 31b, a metal jointed body 300 formed from the Al—Ag alloy layer 34, the Ag—Zn—Al alloy layer 35, the Al—Ag alloy layer 34 is provided, the configuration of the entire laminated body at the joint portion on the side wall is as follows: the upper Al member 31a, the Al—Ag alloy layer 34, the Ag—Zn—Al alloy layer 35, the Al—Ag alloy layer 34, the lower Al member 31b.

Next, a method of manufacturing the wave guide tube 3000 will be described with reference to FIGS. 8A to 8C. The method for joining the upper Al member 31a and the lower Al member 31b as the members to be joined in the wave guide tube 3000 of the present embodiment is partially common to the method for joining the members to be joined in the first embodiment; therefore, the description will be made for points that differ.

First, as shown in FIG. 8A, an upper laminated body 30a which is laminated by forming a Zn film 32 on the upper Al member 31a (Al layer) serving as a member to be joined, and forming an Ag film 33 on a second surface 32b opposite to a first surface 32a joined on the upper Al member 31a on the Zn film 32, and a lower laminated body 30b which is sequentially laminated by forming a Zn film 32 and an Ag film 33 on the lower Al member 31b (Al layer) serving as a member to be joined are produced.

Here, the upper Al member 31a and the lower Al member 31b are Al alloy members containing Al as a main component. The upper Al member 31a and the lower Al member 31b may be any as long as containing Al as the main component, and may be, for example, members containing Al as the main component and of which the residual part contains impurities, or may be members composed of only Al. The upper Al member 31a and the lower Al member 31b preferably contain 99 atom % or more of Al, which is the main component, and even more preferably 100 atom % of Al.

The Zn film 32 is a thin film layer containing Zn as a main component, and the Ag film 33 is a thin film layer containing Ag as a main component. It is desirable that the Zn film 32 and the Ag film 33 contain 99 atom % or more of Zn and Ag, which are the main components, respectively, and it is further preferable that they contain 100 atom % of Zn and Ag. There is no problem even if the residual parts of the Zn film 32 and the Ag film 33 may contain impurities.

Further, the thicknesses of the upper Al member 31a and the lower Al member 31b, serving as the members to be joined, are not particularly limited. Meanwhile, the Zn film 32 is preferably formed to be 0.1 µm or more and 2 µm or less from the viewpoint of forming an alloy by sufficient diffusion of atoms in order to secure stable adhesion. Also, the Ag film 33 is preferably formed to be 0.1 µm) or more and 50 µm) or less from the viewpoint of in addition to improving the joining strength by sufficient diffusion of atoms, forming thereof more uniformly.

The method for forming the Zn film 32, and the Ag film 33 is not particularly limited, and can be formed by, for example, electrolytic plating, electroless plating, physical vapor deposition, chemical vapor deposition, sputtering, or the like. The film forming conditions are not particularly limited and are appropriately set according to the method and apparatus to be used. The film thickness is determined by calculating an appropriate film formation time from the film formation rate in any procedure to be applied.

In the upper laminated body 30a and the lower laminated body 30b thus formed, as shown in FIG. 8A, the Ag films 33 whose surfaces are exposed on their surfaces are opposed to each other. Then, as shown in FIG. 8B, the Ag films 33 of the upper laminated body 30a and the lower laminated body 30b are brought into contact with each other (first step). After that, heating is performed while pressurizing the Ag films 33 in contact with each other to bring the Ag films 33 into close contact with each other (second step). As a result, atomic diffusion occurs between the layers, so that the upper laminated body 30a and the lower laminated body 30b are solid-phase joined to each other. The conditions such as the temperature and pressure for solid-phase joining are the same as the method of manufacturing the metal jointed body 100 in the first embodiment; therefore, the description thereof will be omitted.

When the upper laminated body 30a and the lower laminated body 30b are solid-phase joined in this manner, as shown in FIG. 8C, the joint portion becomes a laminated structure of the upper Al member 31a, the Al—Ag alloy layer 34, the Ag—Zn—Al alloy layer 35, the Al—Ag alloy layer 34, the lower Al member 31b. At this point, a part of the upper Al member 31a and the lower Al member 31b before joining remains as the upper Al member 31a and the lower Al member 31b after joining. A portion having the Al—Ag alloy layers 34 on both sides of the Ag—Zn—Al alloy layer 35 and having a laminated structure of the Al—Ag alloy layer 34, the Ag—Zn—Al alloy layer 35, and the Al—Ag alloy layer 34 is the metal jointed body 300, and the wave guide tube 3000 is completed with the configuration in which the upper Al member 31a and the lower Al member 31b are joined by the metal jointed body 300.

After the laminated structure of the Al—Ag alloy layer 34, the Ag—Zn—Al alloy layer 35, and Al—Ag alloy layer 34 is formed by solid-phase joining, pressurization and heating is halted and cooling is preferably performed by natural heat dissipation. Further, although in solid-phase joining, a concentration gradient due to the diffusion of atoms may be present in each layer, this does not cause a decrease in joining strength. Therefore, the composition of each layer does not have to be uniform in the entire layer. Further, the formed metal jointed body 300 is integrated with the upper Al member 31a, the lower Al member 31b, the Zn film 32, and the Ag film 33; therefore, each boundary between the layers is indefinite.

When the whole structure is assumed to be 100 atom %, it is preferable that the Al—Zn—Ag alloy layer 35 contains Al of 1 atom % or more and 10 atom % or less, Zn component of 1 atom % or more and 40 atom % or less, and of which the residual part contains Ag as the main component. When the whole structure is assumed to be 100 atom %, it is preferable that the Al—Ag alloy layer 34 contains Ag of 1 atom % or more and 10 atom % or less and of which the residual part contains Al as the main component. In addition, in a case where the requirement of the joining strength is not so high or the like, it is not always necessary to use this component ratio.

Although in FIG. 7 and FIG. 8C, the case where the metal jointed body 300 has a rectangular shape in cross section, that is, the Al—Ag alloy layer 34 on the upper Al member 31a side and the Al—Ag alloy layer 34 on the lower Al member 31b side are formed with the same width is shown, the widths are not limited thereto and the Al—Ag alloy layer 34 on the upper Al member 31a side may be formed wider in width than the Al—Ag alloy layer 34 on the lower Al member 31b side. In this case, the metal jointed body 300 has a structure in which the width gradually decreases from the Al—Ag alloy layer 34 on the upper Al member 31a side toward the Al—Ag alloy layer 34 on the lower Al member 31b side.

The effect of the wave guide tube 3000 and the method of manufacturing the wave guide tube 3000 thus configured will be described.

The wave guide tube 3000 and the method of manufacturing the wave guide tube 3000 of the present embodiment do not require the bearing surface for a screw and the thickness of the member corresponding to the bearing surface of the screw, which is indispensable for the fastening structure with screws or the like, exhibiting an effect that the degree of freedom in design improves. Further, the thinner films have the effect of integrating the shape and reducing the weight.

Furthermore, even when the thicknesses of the upper Al member 31a and the lower Al member 31b are reduced, activation using flux and heating to the melting point of the brazing material are not required as in brazing, exhibiting an effect that the contraction and deformation of members from the thermal deformation due to heating is suppressed. In addition, no concern that the brazing material may protrude into the wave guide tube is raised, and if the brazing material is used, there is a concern that the shape may become unstable due to variations in thickness, however an effect is exhibited that such a problem is also suppressed.

Figure 9:
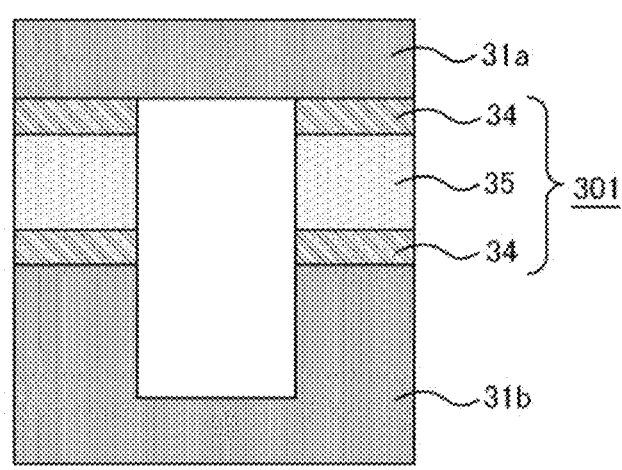
FIG. 9 A cross-sectional view illustrating modification example of the wave guide tube of the third embodiment.

A modification example of the wave guide tube of the present embodiment will be described with reference to FIGS. 9 to 10C. FIG. 3 is a cross-sectional view illustrating a wave guide tube 3001 of the modification example of the wave guide tube 3000 of the present embodiment. FIGS. 10A to 10C, cross-sectional views, are for describing a method of manufacturing the wave guide tube 3001.

In the wave guide of the wave guide tube, the characteristics such as electrical conductivity are improved if Al is Ag-plated, however, Ag plating on the whole is not necessarily required, and even if Al alone, the required characteristics are satisfied in some cases. Further, when the member before joining is uneven, in particular, forming a uniform film by plating or the like is difficult to perform, and when the thickness is required to be accurate for groove formation or the like, for example, it is often the case that it is better not to form an Ag film on the entire surface. Therefore, a decision is required to be made on whether to select a film-forming method or to partially form a film according to the required electrical characteristics and structure.

In the wave guide tube 3001, the Zn film 22 and the Ag film 23 are not formed in the region other than the joint portion between the upper Al member 31a and the lower Al member 31b; therefore, the wave guide tube 3000 of the present embodiment is different from the wave guide tube 3001 in this respect. The other configurations of the wave guide tube 3001 and the metal jointed body 301 are the same as those of the wave guide tube 3000 and the metal jointed body 300 of the present embodiment; therefore, the differences will be mainly described below.

Similar to the wave guide tube 3000, the wave guide tube 3001 is configured by integrally molding a long-axis plate-shaped upper Al member 31a and a long-axis lower Al member 31b having a concave cross section, with a tubular shape having a cavity thereinside. The side wall of the wave guide tube 3001 is joined by forming a metal jointed body 301 having Al—Ag alloy layers 34 on both sides of an Ag—Zn—Al alloy layer 35, as shown in FIG. 9.

Next, a method of manufacturing the wave guide tube 3000 and the wave guide tube 3001 will be described with reference to FIGS. 10A to 10C.

Figure 10A:
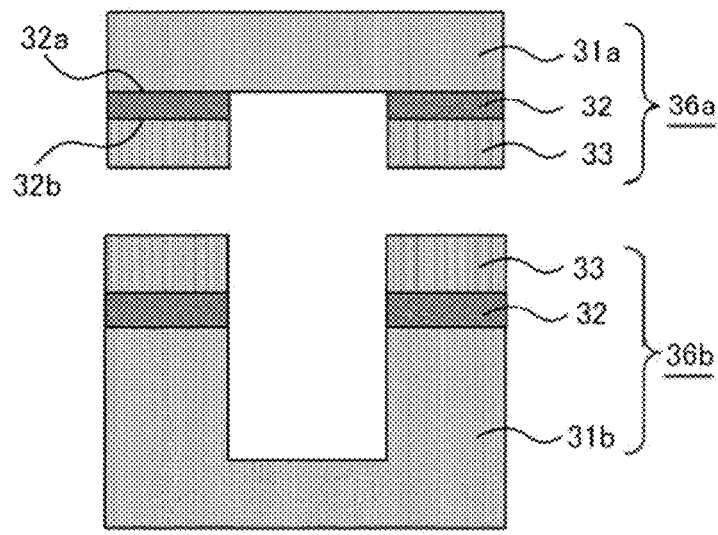
FIGS. 10A to 10C Cross-sectional views for describing a method of manufacturing of a modification example of the wave guide tube of the third embodiment.

First, as shown in FIG. 10A, an upper laminated body 36a in which a Zn film 32 and an Ag film 33 are sequentially laminated only on the joint portion of the upper Al member 31a serving as a member to be joined and a lower laminated body 36b in which a Zn film 32 and an Ag film 33 are sequentially laminated only on the joint portion of the lower Al member 31b serving as a member to be joined are produced. Specifically, the upper laminated body 36a and the lower laminated body 36b are produced by masking a part other than the joint portion in advance before forming a film, or by removing the part other than the joint portion by cutting or the like after entirely forming the film.

Figure 10B:
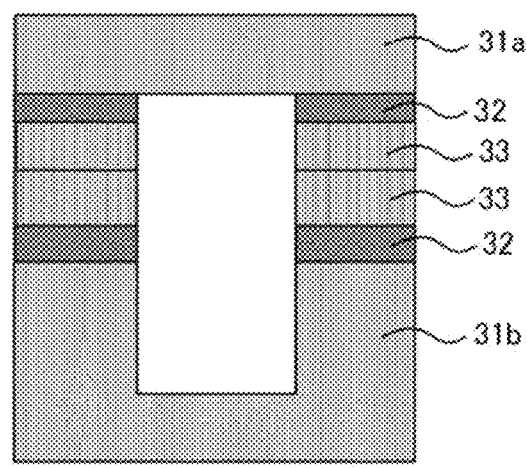

Then, as shown in FIG. 10A, the Ag films 33 are opposed to each other, and as shown in FIG. 10B, the Ag films 33 of the upper laminated body 36a and the lower laminated body 36b are brought into contact with each other (first step). After that, heating is performed while pressurizing the Ag films 33 in contact with each other to bring the Ag films 33 into close contact with each other (second step). As a result, atomic diffusion occurs between the layers, so that the upper laminated body 36a and the lower laminated body 36b are solid-phase joined to each other.

Figure 10C:
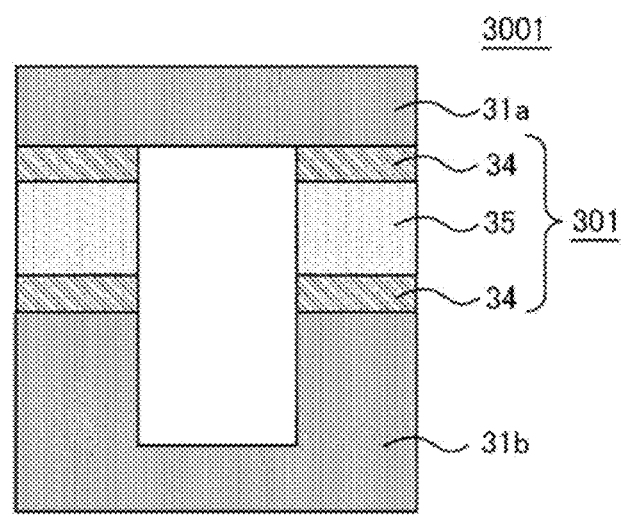

When the upper laminated body 36a and the lower laminated body 36b are solid-phase joined in this manner, as shown in FIG. 10C the entire configuration becomes a laminated structure of the upper Al member 31a, the Al—Ag alloy layer 34, the Ag—Zn—Al alloy layer 35, the Al—Ag alloy layer 34, the lower Al member 31b. At this point, a part of the upper Al member 31a and the lower Al member 31b before joining remains as the upper Al member 31a and the lower Al member 31b after joining. A portion having the Al—Ag alloy layers 34 on both sides of the Ag—Zn—Al alloy layer 35 and having a laminated structure of the Al—Ag alloy layer 34, the Ag—Zn—Al alloy layer 35, and the Al—Ag alloy layer 34 is the metal jointed body 301, and the wave guide tube 3001 is completed with the configuration in which the upper Al member 31a and the lower Al member 31b, serving as members to be joined, are joined by the metal jointed body 301.

In the wave guide tube 3001 and the method of manufacturing the wave guide tube 3001 thus configured, effects are exhibited in which portions where accuracy is required for groove formation or the like, its accuracy is secured, and the degree of freedom in design improves and shape variation can be suppressed.

Although in the above examples, the description has been made on an example of forming a wave guide tube by joining a member having a plate shape on one side and a member having a concave cross section on the other side as members forming the wave guide tube, the configuration is not limited thereto, for example. a wave guide tube formed by joining two members having a concave cross section may also be adopted. Further, the height of the joint surface is not necessarily required to be constant, and the joint surface may have irregularities. Further, the structure is not limited to the joining of two members, and may be a multi-layer structure such as a three-layer structure composed of an upper part, a side part and a lower part.

EMBODIMENTS

Figure 11:
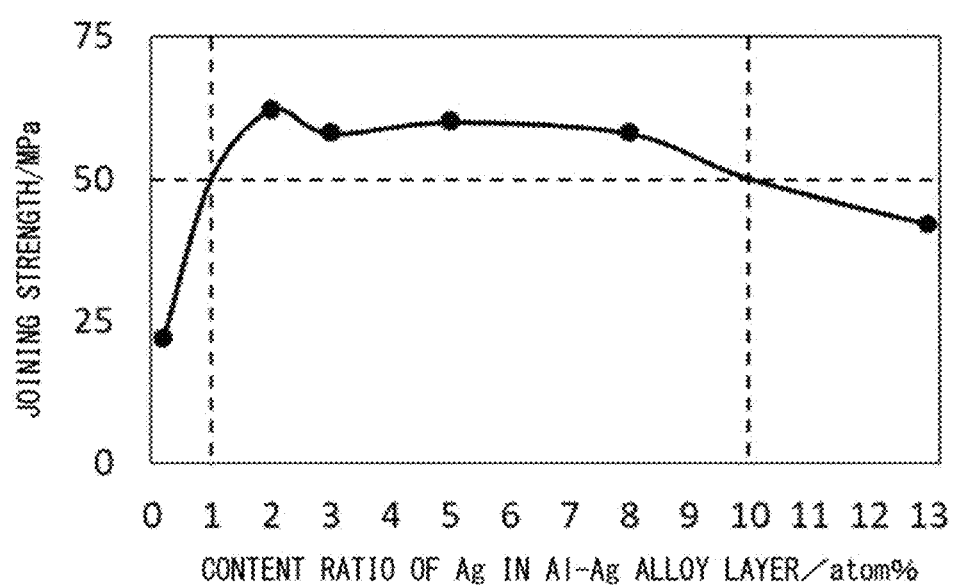
FIG. 11 A graph showing the joining strength with respect to the Ag content in the Al—Ag alloy layer for the metal jointed body of the embodiments.
Figure 13:
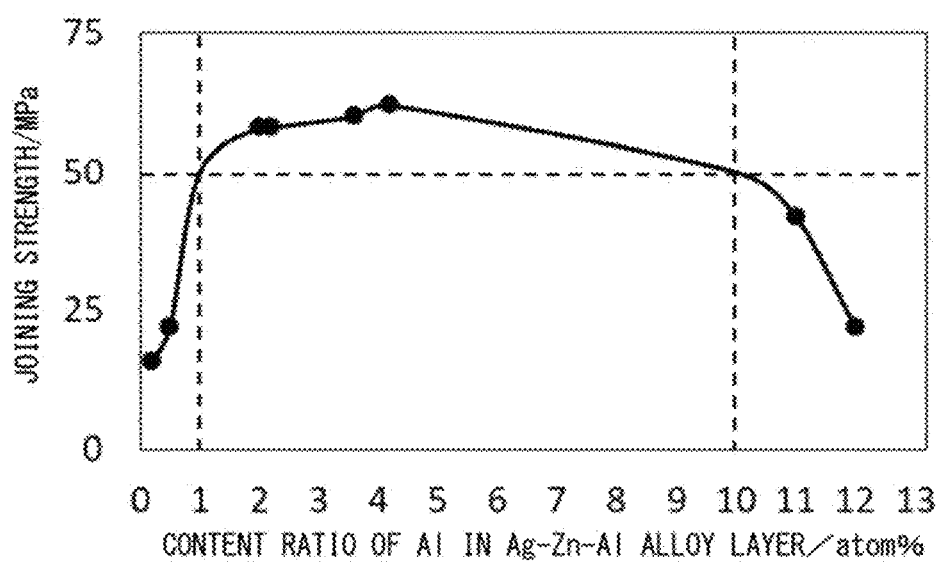
FIG. 13 A graph showing the joining strength with respect to the Al content in the Ag—Zn—Al alloy layer for the metal jointed body of the embodiments.

Hereinafter, Embodiments and Comparative Examples will be specifically described with reference to Table 1 and FIGS. 11 to 13. Table 1 shows, for each Embodiment and each Comparative Example, the film thickness of the Zn film and the film thickness of the Ag film in the laminated body before joining, the Ag ratio in the Al—Ag alloy layer in the metal jointed body after joining, the Zn ratio in the Ag—Zn—Al alloy layer in the metal jointed body after joining, and the Al ratio in the Ag—Zn—Al alloy layer in the metal jointed body after joining, and the joining reliability. FIG. 11 is a graph showing the joining strength with respect to the Ag content ratio in the Al—Ag alloy layer, FIG. 12 is a graph showing the joining strength with respect to the Zn content ratio in the Ag—Zn—Al alloy layer, and FIG. 13 is a graph showing the joining strength with respect to the Zn content ratio in the Ag—Zn—Al alloy layer. The graphs of FIGS. 11 to 13 include plots of data of each Embodiment and each Comparative Example shown in Table 1.

Embodiment 1

First, the surface of the Al alloy member was flattened by machining, and then a 0.3 μm Zn film was formed thereon by a plating process with a film formation time of 45 seconds, and a metal laminate body was prepared by sequentially forming a 5 μm Ag film on the Zn film by a plating process with a film forming time of 34 minutes.

The Ag films of the metal laminate bodies are brought into contact with each other using two of the above-mentioned metal laminate bodies, heated at 320° C. while being pressurized at 10 MPa in the atmosphere for 1 hour to solid-phase joined each other, thereby obtaining a metal jointed body.

The metal jointed body of Embodiment 1 produced as described above is a portion in which Al—Ag alloy layers are provided on both sides of the Ag—Zn—Al alloy layer where the Al alloy members are joined to each other, respectively. The metal jointed body of Embodiment 1 contains 8.0 atom % of Ag in the Al—Ag alloy layer, 6.0 atom % of Zn and 2.0 atom % of Al in the Ag—Zn—Al alloy layer.

Embodiment 2

First, the surface of the Al alloy member was flattened by machining, and then a 0.3 μm Zn film was formed thereon by a plating process with a film formation time of 45 seconds, and a metal laminate body was prepared by sequentially forming a 2 μm Ag film on the Zn film by a plating process with a film forming time of 31 minutes.

The Ag films of the metal laminate bodies are brought into contact with each other using two of the above-mentioned metal laminate bodies, heated at 320° C. while being pressurized at 20 MPa in the atmosphere for 1 hour to solid-phase joined each other, thereby obtaining a metal jointed body.

The metal jointed body of Embodiment 2 produced as described above is a portion in which Al—Ag alloy layers are provided on both sides of the Ag—Zn—Al alloy layer where the Al alloy members are joined to each other, respectively. The metal jointed body of Embodiment 2 contains 3.0 atom % of Ag in the Al—Ag alloy layer, 17.0 atom % of Zn and 2.2 atom % of Al in the Ag—Zn—Al alloy layer.

Embodiment 3

First, the surface of the Al alloy member was flattened by machining, and then a 1 μm Zn film was formed thereon by a plating process with a film formation time of 2 minutes, and a metal laminate body was prepared by sequentially forming a 5 μm Ag film on the Zn film by a plating process with a film forming time of 34 minutes.

The Ag films of the metal laminate bodies are brought into contact with each other using two of the above-mentioned metal laminate bodies, heated at 320° C. while being pressurized at 10 MPa in the atmosphere for 2 hour to solid-phase joined each other, thereby obtaining a metal jointed body.

The metal jointed body of Embodiment 3 produced as described above is a portion in which Al—Ag alloy layers are provided on both sides of the Ag—Zn—Al alloy layer where the Al alloy members are joined to each other, respectively. The metal jointed body of Embodiment 3 contains 5.0 atom % of Ag in the Al—Ag alloy layer, 24.0 atom % of Zn and 3.6 atom % of Al in the Ag—Zn—Al alloy layer.

Embodiment 4

First, the surface of the Al alloy member was flattened by machining, and then a 0.3 μm Zn film was formed thereon by a plating process with a film formation time of 45 seconds, and a metal laminate body was prepared by sequentially forming a 1 μm Ag film on the Zn film by a plating process with a film forming time of 80 minutes.

The Ag films of the metal laminate bodies are brought into contact with each other using two of the above-mentioned metal laminate bodies, heated at 320° C. while being pressurized at 20 MPa in the atmosphere for 2 hour to solid-phase joined each other, thereby obtaining a metal jointed body.

The metal jointed body of Embodiment 4 produced as described above is a portion in which Al—Ag alloy layers are provided on both sides of the Ag—Zn—Al alloy layer where the Al alloy members are joined to each other, respectively. The metal jointed body of Embodiment 4 contains 2.0 atom % of Ag in the Al—Ag alloy layer, 33.0 atom % of Zn and 4.2 atom % of Al in the Ag—Zn—Al alloy layer.

Comparative Example 1

First, the surface of the Al alloy member was flattened by machining, and then a 0.1 μm Zn film was formed thereon by a plating process with a film formation time of 20 seconds, and a metal laminate body was prepared by sequentially forming a 15 μm Ag film on the Zn film by a plating process with a film forming time of 44 minutes.

The Ag films of the metal laminate bodies are brought into contact with each other using two of the above-mentioned metal laminate bodies, heated at 350° C. while being pressurized at 20 MPa in the atmosphere for 4 hour to solid-phase joined each other, thereby obtaining a metal jointed body.

The metal jointed body of Comparative Example 1 produced as described above is a portion in which Al—Ag alloy layers are provided on both sides of the Ag—Zn—Al alloy layer where the Al alloy members are joined to each other, respectively. The metal jointed body of Comparative Example 1 contains 13.0 atom % of Ag in the Al—Ag alloy layer, 0.6 atom % of Zn and 11.0 atom % of Al in the Ag—Zn—Al alloy layer.

Comparative Example 2

First, the surface of the Al alloy member was flattened by machining, and then a 0.3 μm Zn film was formed thereon by a plating process with a film formation time of 45 seconds, and a metal laminate body was prepared by sequentially forming a 0.5 μm Ag film on the Zn film by a plating process with a film forming time of 30 minutes.

The Ag films of the metal laminate bodies are brought into contact with each other using two of the above-mentioned metal laminate bodies, heated at 280° C. while being pressurized at 20 MPa in the atmosphere for 4 hour to solid-phase joined each other, thereby obtaining a metal jointed body.

The metal jointed body of Comparative Example 2 produced as described above is a portion in which Al—Ag alloy layers are provided on both sides of the Ag—Zn—Al alloy layer where the Al alloy members are joined to each other, respectively. The metal jointed body of Comparative Example 2 contains 0.2 atom % of Ag in the Al—Ag alloy layer, 47.0 atom % of Zn and 0.5 atom % of Al in the Ag—Zn—Al alloy layer.

Then, the joining strength of the metal jointed bodies of the respective Embodiments and Comparative Examples obtained as described above was measured by a share test. In Embodiments and Comparative Examples, in order to measure the joining strength by the shear test, subjects of the test used were one metal laminated body and the other metal laminated body before joining different in size.

For the determination of the joining reliability shown in Table 1, 50 MPa, which is the joining strength of the solder material used for joining semiconductor devices and wave guide tubes, is used as an index. In Table 1, ○ represents that the joint reliability is high with the measured joining strength being 50 MPa or more, and Δ represents that the joint reliability is not as good with the measured joining strength being lower than 50 MPa. In this research, Embodiments 1 to 4 are the 4 samples judged to have high joint reliability with the measured joining strength being 50 MPa or more, and Comparative Examples 1 and 2 are the 2 samples judged to be not as good in joint reliability with the measured joining strength being lower than 50 MPa.

TABLE 1

| | Before Joining | | After Joining | | | |
|---|---|---|---|---|---|---|
| | Zn Film Thickness/ μm | Ag Film Thickness/ μm | Ag Content Ratio in Al—Ag Alloy Layer/ atom % | Zn Content Ratio in Ag—Zn—Al Alloy Layer/ atom % | Al Content Ratio in Ag—Zn—Al Alloy Layer/ atom % | Joint Reliability |
| Embodiment 1 | 0.3 | 5 | 8.0 | 6.0 | 2.0 | ○ |
| Embodiment 2 | 0.3 | 2 | 3.0 | 17.0 | 2.2 | ○ |
| Embodiment 3 | 1 | 5 | 5.0 | 24.0 | 3.6 | ○ |
| Embodiment 4 | 0.3 | 1 | 2.0 | 33.0 | 4.2 | ○ |
| Comparative Example 1 | 0.1 | 15 | 13.0 | 0.6 | 11.0 | Δ |
| Comparative Example 2 | 0.3 | 0.5 | 0.2 | 47.0 | 0.5 | Δ |

Further, from the graph shown in FIG. 11, it can be seen that the joining strength is 50 MPa or more, which is the standard, in the range where the Ag content ratio in the Al—Ag alloy layer is 1 atom % or more and 10 atom % or less. Therefore, it can be said that it is preferable that the Al—Ag alloy layer of the metal jointed body contains Ag in an amount of 1 atom % or more and 10 atom % or less. Also in Table 1, in Embodiments 1 to 4 having high joint reliability, the Ag content ratio in the Al—Ag alloy layer is within the range of 1 atom % or more and 10 atom % or less.

Further, from the graph shown in FIG. 12, it can be seen that the joining strength is 50 MPa or more, which is the standard, in the range where the Zn content ratio in the Ag—Zn—Al alloy layer is 1 atom % or more and 40 atom % or less. Therefore, it can be said that it is preferable that the Ag—Zn—Al alloy layer of the metal jointed body contains Zn in an amount of 1 atom % or more and 40 atom % or less. Also in Table 1, in Embodiments 1 to 4 having high joint reliability, the Zn content ratio in the Ag—Zn—Al alloy layer is within the range of 1 atom % or more and 40 atom % or less.

Further, from the graph shown in FIG. 13, it can be seen that the joining strength is 50 MPa or more, which is the standard, in the range where the Al content ratio in the Ag—Zn—Al alloy layer is 1 atom % or more and 10 atom % or less. Therefore, it can be said that it is preferable that the Ag—Zn—Al alloy layer of the metal jointed body contains Al in an amount of 1 atom % or more and 10 atom % or less. Also in Table 1, in Embodiments 1 to 4 having high joint reliability, the Al content ratio in the Ag—Zn—Al alloy layer is within the range of 1 atom % or more and 10 atom % or less.

As a result, when the whole structure is assumed to be 100 atom %, it has been determined that it is preferable that the Ag—Zn—Al alloy layer contains Al of 1 atom % or more and 10 atom % or less, Zn component of 1 atom % or more and 40 atom % or less, and of which the residual part contains Ag as the main component. When the whole structure is assumed to be 100 atom %, it has been determined that it is preferable that the Al—Ag alloy layer contains Ag of 1 atom % or more and 10 atom % or less and of which the residual part contains Al as the main component. In addition, in a case where the requirement of the joining strength is lower than 50 MPa, it is not always necessary to use this component ratio.

It should be noted that the Embodiments of the present disclosure can be arbitrarily combined and can be appropriately modified or omitted without departing from the scope of the disclosure.

EXPLANATION OF REFERENCE SIGNS

1 Al substrate (Al layer), 2, 22, 32 Zn film (Zn layer), 3, 23, 33 Ag film (Ag layer), 4, 24, 34 Al—Ag alloy layer, 5, 25, 35 Ag—Zn—Al alloy layer, 10 metal laminated body, 11 metal base, 12 wiring board, 12a, 12b front surface conductor layer, 12c back surface conductor layer, 12d ceramic substrate, 13 semiconductor element, 14 adhesive, 15 case, 16 external terminal, 17 wire, 18 sealing material, 21 Al film (Al layer), 30a, 36a upper laminated body, 30b, 36b lower laminated body, 31a upper Al member (Al layer), 31b lower Al member (Al layer), 100, 200, 300, 301 metal jointed body, 2000 semiconductor device, 3000, 3001 wave guide tube.

The invention claimed is:

1. A metal jointed body comprising:
an Ag—Zn—Al alloy layer; and
an Al—Ag alloy layer provided on both sides of the Ag—Zn—Al alloy layer,
wherein the Ag—Zn—Al alloy layer contains 1 atom % or more and 10 atom % or less of Al and 1 atom % or more and 40 atom % or less of Zn.

2. The metal jointed body according to claim 1, wherein the Al—Ag alloy layer contains 1 atom % or more and 10 atom % or less of Ag.

3. A semiconductor device comprising:
a metal base;
a wiring board joined on the metal base; and
a semiconductor element joined on a surface opposite to a surface of the wiring board joined to the metal base, wherein
the metal jointed body according to claim 1 is provided in at least one of between the metal base and the wiring board and between the wiring board and the semiconductor element.

4. A wave guide tube with a tubular shape having a cavity therein, wherein
a part of a side wall of the wave guide tube is joined by a metal jointed body, the metal jointed body comprising:
an Ag—Zn—Al alloy layer; and
an Al—Ag alloy layer provided on both sides of the Ag—Zn—Al alloy layer.

5. The wave guide tube according to claim 2, wherein
the wave guide tube composed of a first member and a second member, and forms the cavity in a region surrounded by the first member and the second member, and
the first member and the second member are joined by the metal jointed body.

6. A method for joining members to be joined in which a laminated body is used, the laminated body is such that a Zn layer is joined and laminated on an Al layer which is an Al substrate serving as a member to be joined or an Al film formed on a member to be joined, and an Ag layer is joined and laminated on a surface opposite to a surface of the Zn layer joined on the Al layer, the method comprising the steps of:
a first step of making each of the Ag layers of the two laminated bodies opposed to each other and bringing the Ag layers into contact with each other; and
a second step of performing heating the two laminated bodies with the Ag layers in contact with each other while pressurizing, wherein
the Zn layer is 0.1 μm or more and 2 μm or less in thickness, and
the Ag layer is 0.1 μm or more and 50 μm or less in thickness.

7. The method for joining the members to be joined according to claim 6, wherein
the Zn layer contains Zn of 99 atom % or more, and
the Ag layer contains Ag of 99 atom % or more.

8. The method for joining the members to be joined according to claim 6, wherein
the second step is performed in the atmosphere.

9. The method for joining the members to be joined according to claim 6, wherein
in the second step, the heating is performed at 250° C. or higher and 400° C. or lower.

10. The metal jointed body according to claim 4, wherein the Ag—Zn—Al alloy layer contains:
1 atom % or more and 10 atom % or less of Al, and
1 atom % or more and 40 atom % or less of Zn.

11. The metal jointed body according to claim 10, wherein the Al—Ag alloy layer contains 1 atom % or more and 10 atom % or less of Ag.

* * * * *